US008675628B2

(12) United States Patent
Fujimura et al.

(10) Patent No.: US 8,675,628 B2
(45) Date of Patent: Mar. 18, 2014

(54) DEMULTIPLEXING APPARATUS, MULTIPLEXING APPARATUS, COMMUNICATION APPARATUS, AND RELAY SATELLITE

(75) Inventors: Akinori Fujimura, Tokyo (JP); Yasushi Sogabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 483 days.

(21) Appl. No.: 13/129,126

(22) PCT Filed: Sep. 30, 2009

(86) PCT No.: PCT/JP2009/067083
§ 371 (c)(1),
(2), (4) Date: May 13, 2011

(87) PCT Pub. No.: WO2010/064485
PCT Pub. Date: Jun. 10, 2010

(65) Prior Publication Data
US 2011/0222467 A1    Sep. 15, 2011

(30) Foreign Application Priority Data

Dec. 1, 2008   (JP) ................................ 2008-306750

(51) Int. Cl.
*H04J 1/00*    (2006.01)
*H04L 27/06*   (2006.01)

(52) U.S. Cl.
USPC ........... 370/343; 370/480; 370/497; 375/340; 455/313

(58) Field of Classification Search
None
See application file for complete search history.

(56) References Cited

U.S. PATENT DOCUMENTS

| | | | |
|---|---|---|---|
| 6,714,529 B1* | 3/2004 | Tanabe et al. | 370/343 |
| 7,936,742 B2* | 5/2011 | Kobayashi et al. | 370/343 |
| 2007/0259631 A1* | 11/2007 | Ljung et al. | 455/127.2 |
| 2009/0304031 A1* | 12/2009 | Kobayashi et al. | 370/497 |

FOREIGN PATENT DOCUMENTS

| | | |
|---|---|---|
| JP | 8 84049 | 3/1996 |
| JP | 2001 111639 | 4/2001 |
| WO | 2007 136010 | 11/2007 |
| WO | 2008 050766 | 5/2008 |

OTHER PUBLICATIONS

U.S. Appl. No. 13/511,893, filed May 24, 2012, Fujimura.

(Continued)

*Primary Examiner* — Robert Scheibel
(74) *Attorney, Agent, or Firm* — Oblon, Spivak, McClelland, Maier & Neustadt, L.L.P.

(57) ABSTRACT

A demultiplexing apparatus includes, in each of n stages, $2^n$ FC+RXHBFs that down-sample a signal, from which a high-frequency component is removed after frequency conversion is carried out, and output the signal. The demultiplexing apparatus extracts, from an input signal including a plurality of band signals, the band signals to thereby demultiplex the input signal. The demultiplexing apparatus includes a reception-filter-bank control unit that calculates, based on channel information including bands and frequency arrangement of the band signals, a dividing position on a frequency axis and a frequency offset value indicating a frequency conversion value and instructs the FC+RXHBF, which is set as a target of output of divided signals of the input signal, about the calculated values. The FC+RXHBF carries out frequency conversion based on the frequency offset value.

13 Claims, 24 Drawing Sheets

(56) References Cited

OTHER PUBLICATIONS

Tanabe, K., et al., "Seamless Multirate Filter Bank," The Institute of Electronics, Information and Communication Engineers, Technical Report of IEICE, pp. 9-14, (May 1999) (with English Abstract).

Tanabe, K., et al., "A Study of Multirate Digital Modulator/Demodulator Employing Seamless Multirate Filter Bank," NTT Network Innovation Laboratories Wireless Systems Laboratory, Proceedings of the 1999 Communications Society Conference of IEICE 1, p. 178, total 6 pages, (Aug. 16, 1999) (with English language translation).

International Search Report issued Nov. 17, 2009 in PCT/JP09/067083 filed Sep. 30, 2009.

* cited by examiner

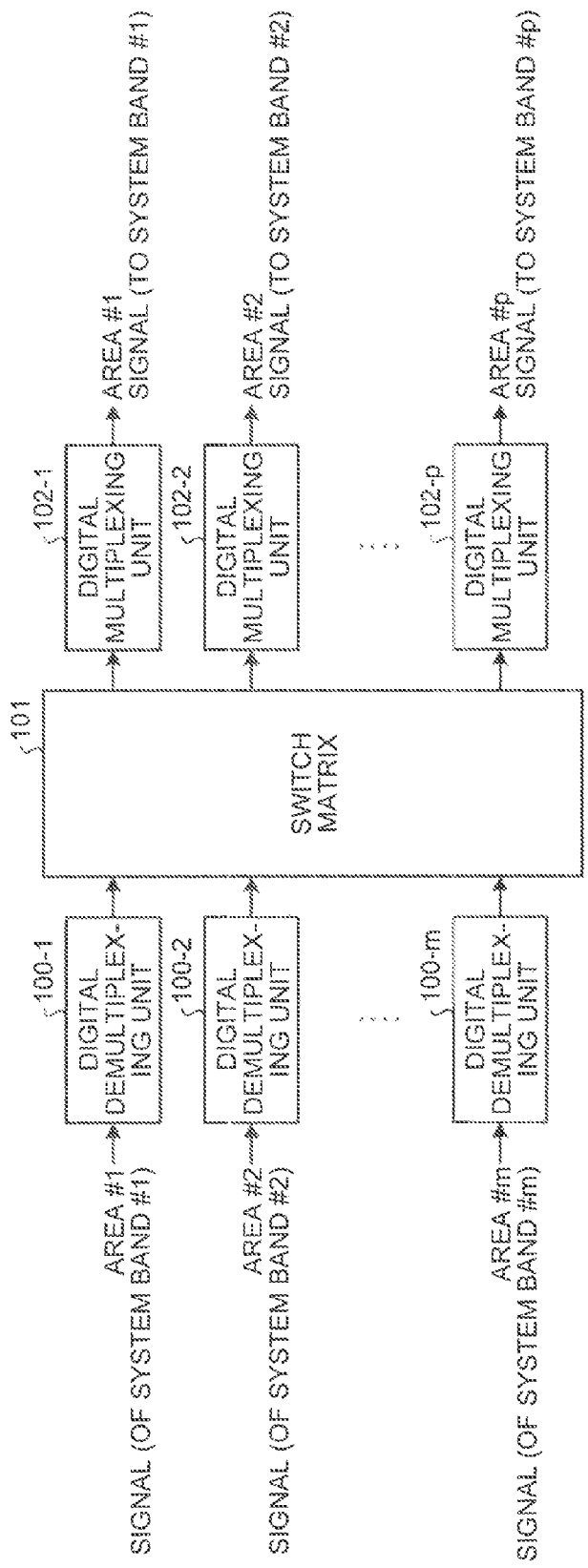

DEMULTIPLEXING APPARATUS, MULTIPLEXING APPARATUS, COMMUNICATION APPARATUS, AND RELAY SATELLITE

FIELD

The present invention relates to a demultiplexing apparatus, a multiplexing apparatus, a communication apparatus, and a relay satellite that subject a plurality of signals having various band width to digital demultiplexing and digital multiplexing.

BACKGROUND

In the past, for example, there has been a technology described in Patent Literature 1 as a technology concerning a digital multiplexing apparatus and a digital demultiplexing apparatus adapted to multiple rates. The operations of a digital signal demultiplexing apparatus and a digital signal multiplexing apparatus described in Patent Literature 1 are explained below. This digital signal demultiplexing apparatus includes an A/D (Analog to Digital) conversion unit that converts an analog signal into a digital signal, a plurality of reception half-band filters that allow frequencies corresponding to respective bands to pass, down-sample a sampling rate to a half of an input data rate, and output the frequencies, a reception selector unit, a frequency reverse offset unit, a reception-waveform-shaping filter unit, and a demodulation processing unit.

The digital signal multiplexing apparatus described in Patent Literature 1 includes a modulation processing unit, a digital multiplexing unit, a transmission-waveform-shaping filter unit, a transmission selector unit, a frequency offset unit, a plurality of transmission half-band filters that up-sample a sampling rate to a double of an input data rate, allow frequencies corresponding to respective bands to pass, and output the frequencies, an adder, and a D/A (Digital to Analog) conversion unit.

Each of the reception half-band filters includes a band-pass filter and a down-sampler. The band-pass filter has frequency characteristics suitable for a band to which the band-pass filter corresponds. Each of the transmission half-band filters includes an up-sampler and a band-pass filter. The configuration of this band-pass filter is the same as that of the reception half-band filter.

In a signal spectrum after passing the band-pass filter of the reception half-band filter, an input signal in a pass-band directly passes and a signal in a stop-band is removed. A signal in a transition region located between the pass-band and the stop-band is not completely removed and remains as a triangular spectrum.

The down-sample in the reception half-band filter down-samples a sampling frequency $f_{samp}$ to a half with respect to a signal after passing the band-pass filter. According to this down-sampling processing, a signal component present in a band of 0.5 $f_{samp}$ to 1.0 $f_{samp}$ [Hz] before the down-sampling is superimposed in a frequency axis direction on a signal component present in a band of 0 to 0.5 $f_{samp}$ by aliasing. Therefore, a signal component in a pass-band overlaps a signal component in a stop-band. However, because the signal component in the stop-band is removed by the band-pass filter, it is possible to realize down-sampling without causing deterioration in an SN (Signal to Noise) ratio of the signal component in the pass-band.

The digital demultiplexing apparatus in the past repeats, for example, the band-pass filtering processing and the down-sample processing set to frequency characteristics corresponding to any one of bands #0 to #3 until a frequency is down-sampled to a desired sampling frequency and a desired signal band.

The digital demultiplexing apparatus selects data, which is designated by a channel control signal from a system side, from complex baseband data (a signal after filtering) output from each of the reception half-band filters and outputs the data. For example, when four outputs are selected, the frequency reverse offset unit, the reception-waveform-shaping filter, and the demodulation processing unit in the post-stage apply signal processing to these four data.

On the other hand, in a complex baseband signal down-sampled to a desired sampling frequency $f_{AD}/(2n)$ [Hz] by the processing by each of the reception half-band filters, a center frequency is not zero and moves to $f_{AD}/2(n+2)$ [Hz]. In general, the demodulation processing unit at the post-stage performs detection processing with a center frequency of a baseband signal set to zero. Therefore, the frequency reverse offset unit frequency-converts the center frequency of the complex baseband signal down-sampled to the desired signal band such that the center frequency changes from $\pm f_{AD}/2(n+2)$ [Hz] to zero.

The reception-waveform-shaping filter unit performs waveform shaping of a reception signal while extracting a main signal of the complex baseband signal, the center frequency of which is frequency-converted into zero. According to this processing, a harmonic (alias) component (the triangular portion) remaining without being able to be removed by the reception half-band filter can be removed.

The digital signal multiplexing apparatus described in Patent Document 1 is explained below. Like the reception half-band filter, the transmission half-band filter of this digital multiplexing apparatus has frequency characteristics corresponding to any one of the bands. Like the reception half-band filter, the transmission half-band filter realizes these frequency characteristics by selecting any complex coefficient corresponding to each of the bands and setting the coefficient in the band-pass filter.

If it is assumed that a sampling frequency of a transmission signal modulated by the modulating unit and shaped by the transmission-waveform-shaping filter is 0.5 $f_{smap}$ [Hz], the frequency offset unit frequency-offsets a center frequency of a baseband complex signal output from the transmission-waveform-shaping filter by $\pm 0.5\ f_{smap}/4_p$ [Hz]. An offset value is different depending on a band to which filter characteristics of a band-pass filter correspond.

The up-sampler of the transmission half-band filter up-converts a sampling rate to a double with respect to data after frequency conversion. The band-pass filter carries out filtering.

Thereafter, the transmission half-band filter in the past repeats the processing of the up-sample and the processing by the band-pass filter while combining output signals of the transmission half-band filters in the adder until a frequency reaches a desired sampling frequency.

CITATION LIST

Patent Literature

Patent Literature 1: Japanese Patent Application Laid-open No. 2001-111639

DISCLOSURE OF INVENTION

Problem to be Solved by the Invention

However, according to the technology in the past, although signals having various band widths can be subjected to digital demultiplexing and digital multiplexing, arrangement on a frequency axis of the band signals is limited to arrangement set in advance. Therefore, there is a problem in that, when there is a free channel in a frequency band that cannot be dealt with by the limited arrangement, a frequency band cannot be allocated to correspond to the free channel and frequency use efficiency falls.

Even when a signal band as a target of multiplexing and demultiplexing is a part of a system band (=a frequency band of a D/A sampling frequency and an A/D sampling frequency), control of a circuit operation is not performed using information concerning the signal band and all circuits basically operate. Therefore, there is a problem in that power consumption cannot be reduced.

The reception half-band filter and the transmission half-band filter include the band-pass filters. However, multipliers of the band-pass filters that realize the band-pass filters perform complex multiplication processing of a complex data sequence and a complex coefficient. Therefore, there is a problem in that a circuit size increases.

Further, because the band-pass filter is used, a frequency reverse-offset unit and a frequency offset unit are necessary according to a system of the band-pass filter. Therefore, there is a problem in that a circuit configuration is complicated.

The present invention has been devised in view of the above and it is an object of the present invention to obtain a demultiplexing apparatus, a multiplexing apparatus, a communication apparatus, and a relay satellite that can reduce limitation of frequency arrangement, realize a simple circuit configuration, and, when an entire signal band width as a target of demultiplexing and multiplexing is a part of a system band, reduce power consumption according to the entire signal band width.

Means for Solving Problem

In order to solve the aforementioned problems and attain the aforementioned object, a demultiplexing apparatus according to one aspect of the present invention is constructed in such a manner as to include, when n (n is a natural number) represents a number of stages of cascade connection, in each of the stages, 2n frequency converting low-pass filter units that apply frequency conversion to a processing target signal, remove a high-frequency component of a signal after the frequency conversion using low-pass filters having predetermined frequency characteristics, and down-sample and output a signal after the high-frequency component removal, the demultiplexing apparatus setting, in the frequency converting low-pass filter unit in a first stage, an input signal including a plurality of band signals, bands of which do not overlap, as the processing target signal, setting, in the frequency converting low-pass filter unit in a second and further stages, an output result of the frequency converting low-pass filter unit in a pre-stage as the processing target signal, and extracting the band signals based on output signals of the frequency converting low-pass filter unit to thereby demultiplex the input signal, the demultiplexing apparatus comprising a reception-filter-bank control unit that calculates, based on channel information as known information including the bands and frequency arrangement of the band signals, a dividing position on a frequency axis for the processing target signal and a frequency offset value indicating a frequency conversion amount for divided signals divided in the dividing position and instructing, for each of the divided signals, the frequency converting low-pass filter unit, which sets the divided signal as a target of an output, about the frequency offset value, wherein the frequency converting low-pass filter unit carries out the frequency conversion based on the frequency offset value.

Advantageous Effects of Invention

According to the present invention, a dividing position and an offset amount of a frequency are determined based on reception channel information and a reception signal is demultiplexed based on a determination result. Therefore, there is an effect that it is possible to realize a simple circuit configuration and, when an entire signal band width as a target of demultiplexing and multiplexing is a part of a system band, reduce power consumption according to a ratio of the entire signal band width.

BRIEF DESCRIPTION OF DRAWINGS

FIG. 24 is a diagram of a configuration example of a relay satellite according to a third embodiment.

DESCRIPTION OF EMBODIMENTS

Embodiments of a demultiplexing apparatus, a multiplexing apparatus, a communication apparatus, and a relay satellite according to the present invention are explained in detail below with reference to the drawings. The present invention is not limited by the embodiments.

First Embodiment.

Figure 1:
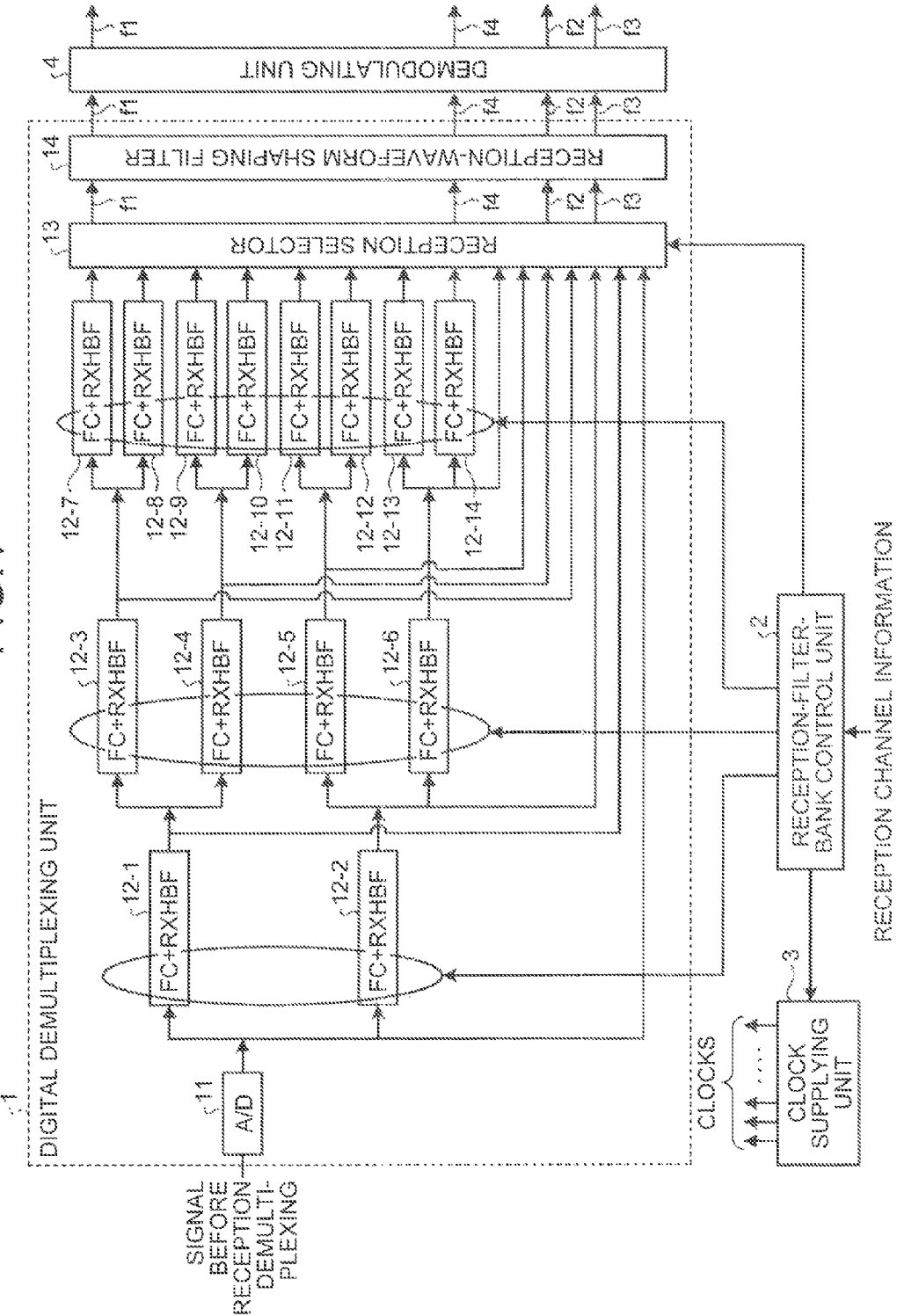
FIG. 1 is a diagram of a functional configuration example of a first embodiment of a demultiplexing apparatus according to the present invention.

FIG. 1 is a diagram of a functional configuration example of a first embodiment of a demultiplexing apparatus according to the present invention. The demultiplexing apparatus according to this embodiment includes a digital demultiplexing unit 1, a reception-filter-bank control unit 2, a clock supplying unit 3 that supplies a clock to components included in the demultiplexing apparatus, and a demodulating unit 4. The digital demultiplexing unit 1 includes an A/D conversion unit (A/D) 11, frequency converting/reception-low-pass filters (FC+RXHBFs) 12-1 to 12-14 that apply frequency conversion and low-pass filter processing to a signal and then down-sample a sampling rate of the signal to a half of an input data rate and output the signal, a reception selector 13, and a reception-waveform shaping filter 14.

Figure 2:
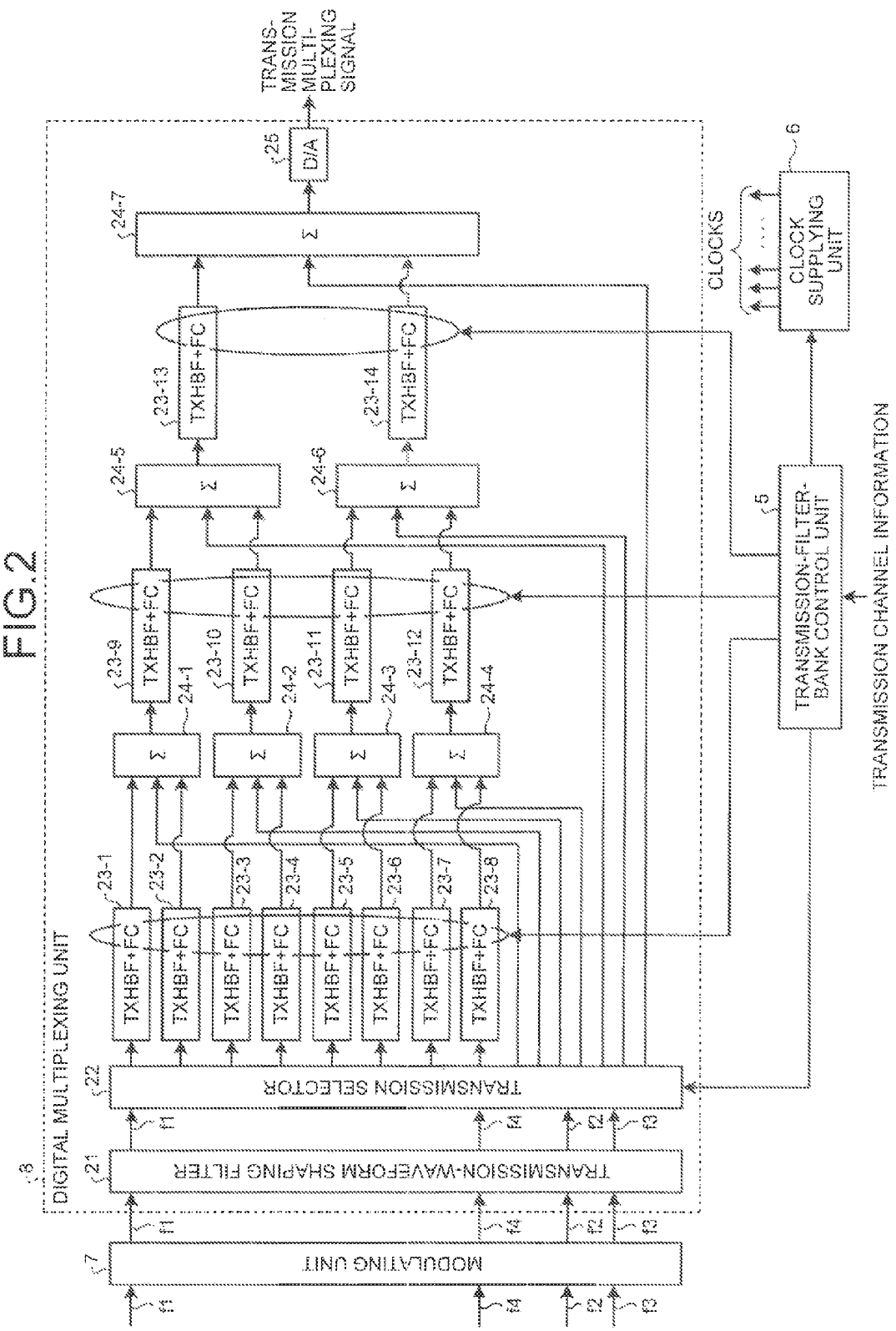
FIG. 2 is a diagram of a functional configuration example of the first embodiment of a multiplexing apparatus according to the present invention.

FIG. 2 is a diagram of a functional configuration example of the first embodiment of a multiplexing apparatus according to the present invention. The multiplexing apparatus according to this embodiment includes a transmission-filter-bank control unit 5, a clock supplying unit 6, a modulating unit 7, and a digital multiplexing unit 8. The digital multiplexing unit 8 includes a transmission-waveform shaping filter 21, a transmission selector 22, transmission low-pass filter/frequency converting units (TXHBF+FCs) 23 that interpolate a sampling rate of a signal to a double of an input data rate and then frequency-convert the signal and output the signal, adders 24-1 to 24-7, and a D/A conversion unit (D/A) 25.

The digital demultiplexing apparatus shown in FIG. 1 and the digital multiplexing apparatus shown in FIG. 2 have a configuration example of three stages including frequency converting/low-pass filters or transmission low-pass filter/frequency converting units in three stages. When the number of stages is represented as stage (=1, 2, 3, . . . ), a maximum number of times of demultiplexed waves/multiplexed waves can be represented as $2^{stage}$. Therefore, in the configuration of this embodiment, because stage=3, demultiplexing/multiplexing of maximum eight (=$2^3$) waves is realized. In the explanation of this embodiment, the number of stages is assumed to be three. However, the number of stages is not limited to this. The present invention can be applied when the number of stages is equal to or larger than four.

Figure 3:
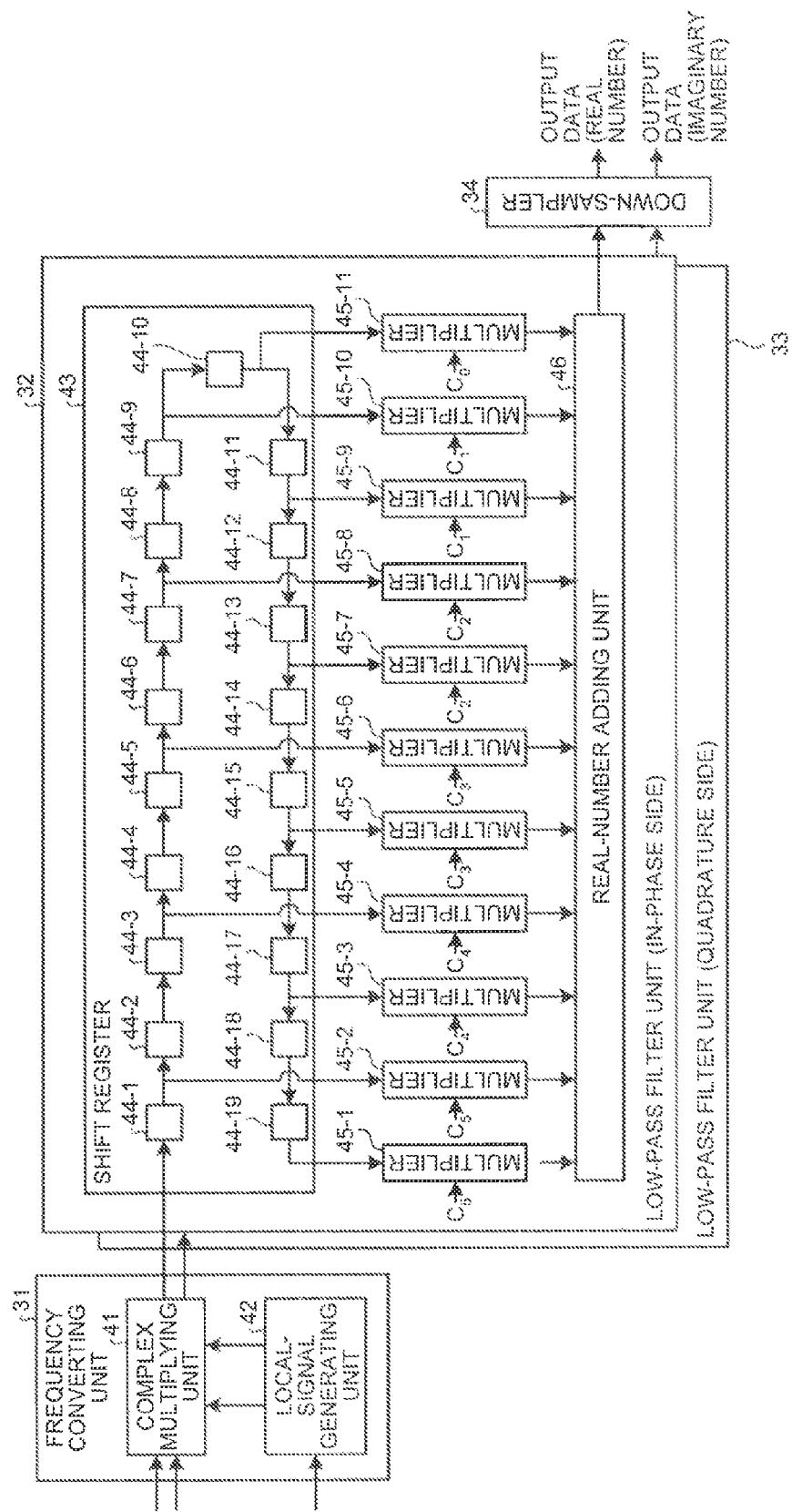
FIG. 3 is a diagram of a configuration example of a frequency converting/reception-low-pass filter unit.

FIG. 3 is a diagram of a configuration example of a frequency converting/reception-low-pass filter unit 12-$i$ ($i$=1 to 14). The number of taps of a filter is set to nineteen. The frequency converting/reception-low-pass filter unit 12-$i$ includes a frequency converting unit 31 that realizes arbitrary (free) frequency offset according to external setting, a low-pass filter unit (in-phase side) 32, a low-pass filter unit (quadrature side) 33, and a down-sampler 34 that curtails output data of the low-pass filter unit (in-phase side) 32 and the low-pass filter unit (quadrature side) 33 to a half (=curtails data at a rate of once in two times). The low-pass filter unit (in-phase side) 32 includes a shift register 43, multipliers 45-1 to 45-11, and a real-number adding unit 46. The shift register 43 includes registers 44-1 to 44-19. The frequency converting unit 31 includes a complex multiplying unit 41 and a local-signal generating unit 42. The low-pass filter unit (quadrature side) 33 has a configuration same as that of the low-pass filter unit (in-phase side) 32.

Figure 4:
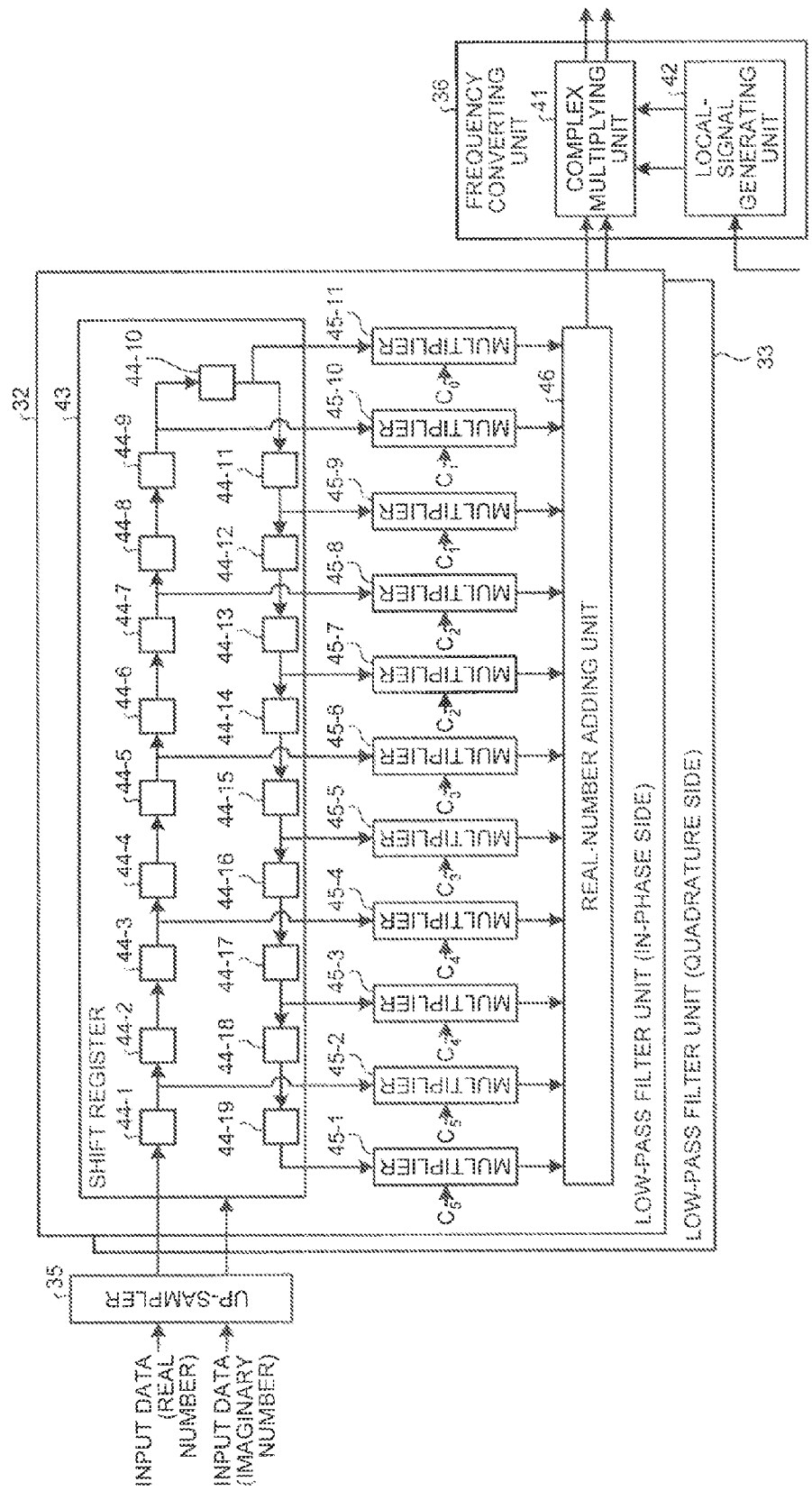
FIG. 4 is a diagram of a configuration example of a transmission-low-pass filter/frequency converting unit.

FIG. 4 is a diagram of a configuration example of a transmission low-pass filter/frequency converting unit 23-$i$ ($i$=1 to 14). Components having functions same as those of the frequency converting/reception low-pass filter unit 12-$i$ shown in FIG. 3 are denoted by the same reference numerals and signs. The transmission low-pass filter/frequency converting unit 23-$i$ includes an up-sampler 35 that up-samples input data (a real number, an imaginary number) to a double (=inserts one zero between input data), a low-pass filter unit (in-phase side) 32, a low-pass filter unit (quadrature side) 33, and a frequency converting unit 36. The frequency converting unit 36 has a configuration same as that of the frequency converting unit 31.

Figure 5:
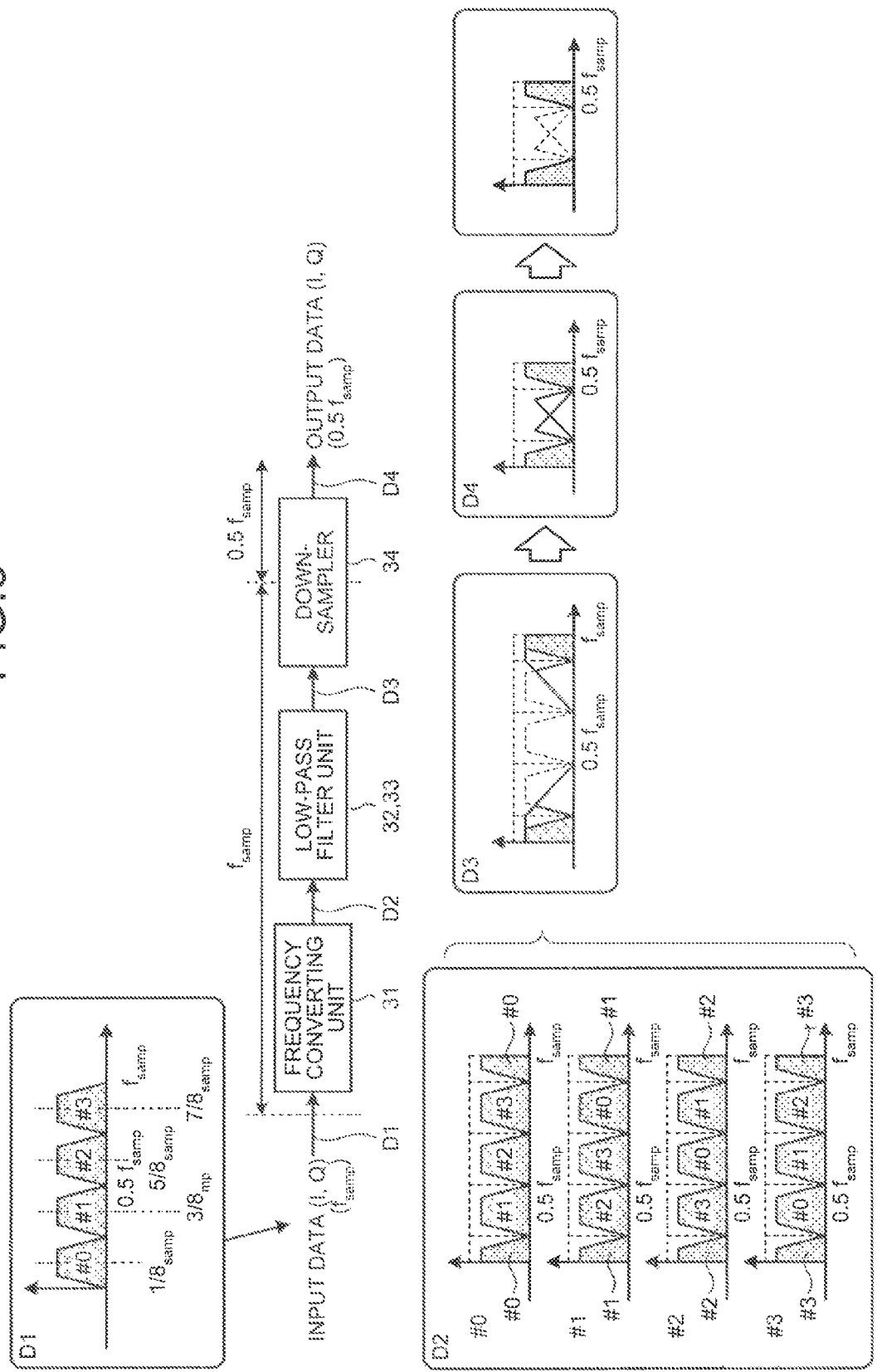
FIG. 5 is a diagram of an operation example of the frequency converting/reception-low-pass filter unit.
Figure 6:
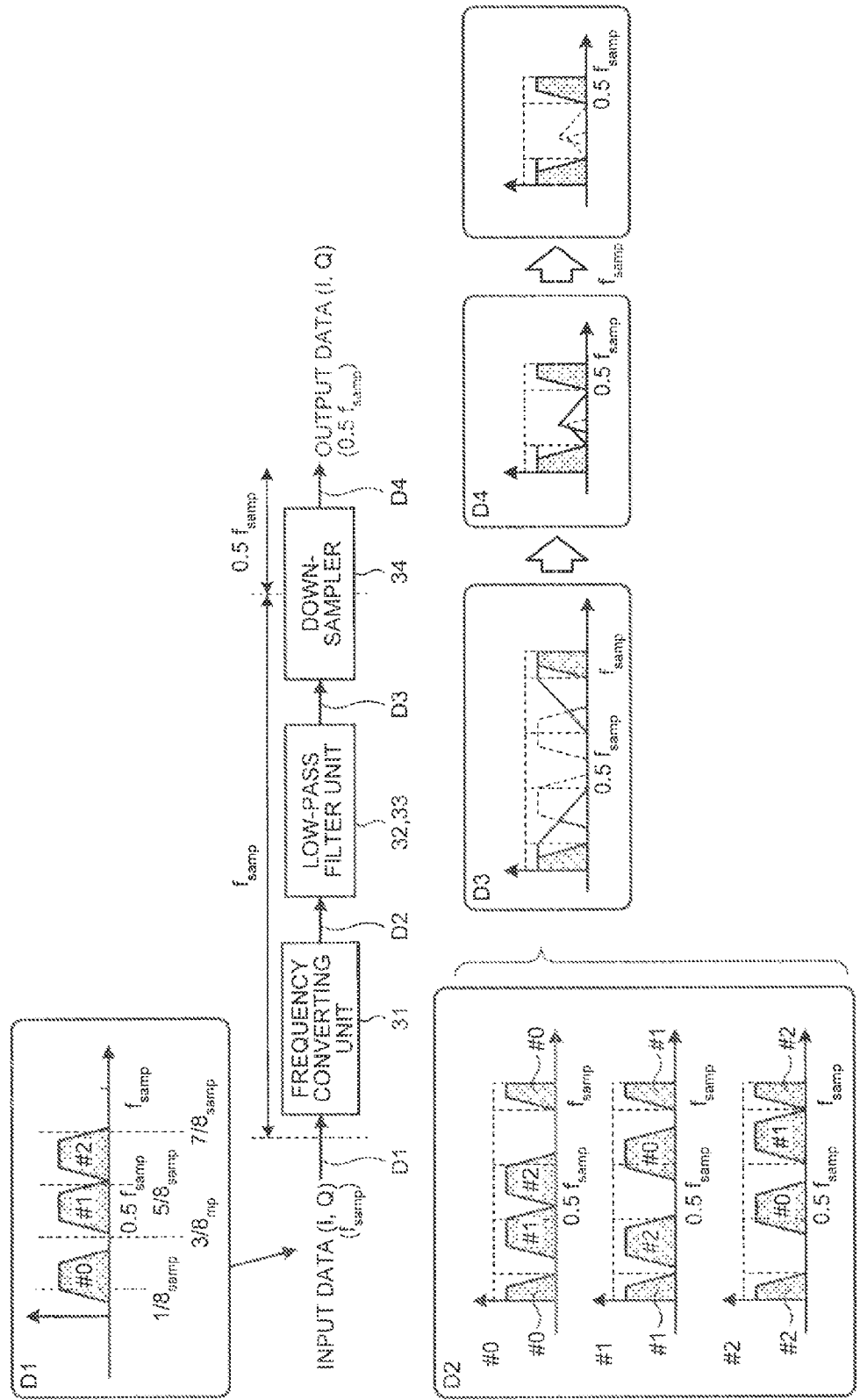
FIG. 6 is a diagram of another operation example of the frequency converting/reception-low-pass filter unit.

Before explaining the overall operation, first, the operations of the frequency converting/reception-low-pass filter unit 12-$i$ and the transmission low-pass filter/frequency converting unit 23-$i$ are explained. FIG. 5 is a diagram of an operation example of the frequency converting/reception-low-pass filter unit 12-$i$. FIG. 6 is a diagram of another operation example of the frequency converting/reception-low-pass filter unit 12-$i$.

The frequency converting/reception-low-pass filter unit 12-$i$ extracts, with a low-pass filter having a predetermined filter characteristic, a part of an input signal band (bandwidth $f_{SAMP}$) sampled at a sampling frequency $f_{SAMP}$ while down-converting a center frequency into zero. This filter characteristic (a frequency characteristic) includes at least a region of 0.25 $f_{SAMP}$ to 0.75 $f_{SAMP}$ as a stop region.

For example, as shown as data D1 on the upper left of FIG. 5, it is assumed that four signal spectra #0 to #3 are present in a band of an input signal. First, as shown as data D2 in FIG. 5, the frequency converting unit 31 of the frequency converting/reception-low-pass filter unit 12-$i$ performs frequency conversion to convert a center frequency of extracted bands respectively set based on a frequency offset method explained later into zero.

For example, in the frequency-converting/reception-low-pass filter unit 12-$i$ set to extract a band #0, the frequency converting unit 31 frequency-converts a center frequency (in this example, ⅛ $f_{SAMP}$) of the band #0 into zero. Similarly, the frequency converting unit 31 of the frequency converting/reception-low-pass filter unit 12-$i$ set to extract bands #1, #2, and #3 frequency-converts center frequencies (in this example, ⅜ $f_{SAMP}$, ⅝ $f_{SAMP}$, and ⅞ $f_{SAMP}$) of the bands #1, #2, and #3 into zero.

Subsequently, the low-pass filter unit (in-phase side) 32 and the low-pass filter unit (quadrature side) 33 allow a signal in a band, a center frequency of which is frequency-converted into zero, to pass with respect to the data D2 output from the frequency converting unit 31, remove a signal component of a predetermined stop region (in this example, including at least a region of 0.25 $f_{SAMP}$ to 0.75 $f_{SAMP}$) and output the signal to the down-sampler 34 as data D3 after filtering.

The down-sampler 34 curtails the input data D3 to a half. Therefore, a frequency component in a region of 0.5 $f_{SAMP}$ to 1.0 $f_{SAMP}$ of the data before being curtailed overlap a frequency component in a region of 0.0 $f_{SAMP}$ to 0.5 $f_{SAMP}$. However, because a signal component in a region of 0.25 $f_{SAMP}$ to 0.75 $f_{SAMP}$ is removed by the low-pass filter in advance, an alias component is removed in a signal band of an extraction target and S/N deterioration is not caused.

In the demultiplexing processing in this embodiment, processing as a set of the frequency conversion processing, the filter processing by the low-pass filter, and the down-sample processing is repeated until a sampling frequency after down-sample increases to a double of signal band width that should originally be extracted.

After the end of the processing, the reception selector 13 selects a signal designated by a reception selection signal transmitted from the reception-filter-bank control unit among signals demultiplexed by the processing. The reception-waveform shaping filter (or a narrow-band low-pass filter) 14 removes a remaining harmonic component from the selected signal and extracts only a target signal.

As shown in FIG. 6, it is assumed that, in the input data D1, center frequencies of signals as extraction targets shift from those in the case of FIG. 5 and amounts of the shift are different depending on extraction bands. In this case, if frequency conversion is performed with offset amounts (m/8 $f_{SAMP}$, m=1, 3, 5, 7) same as those in the example shown in FIG. 5, the center frequencies of the extraction bands do not decrease to zero. The frequency converting unit 31 in this embodiment can freely offset the frequency of an input signal to an arbitrary value. Therefore, the frequency converting unit 31 can set offset amounts for respectively setting the extraction bands (the bands #0 to #2) to zero and frequency-convert the center frequencies of the extraction target bands into zero. Processing after the frequency conversion is the same as that in the example shown in FIG. 5.

Figure 7:
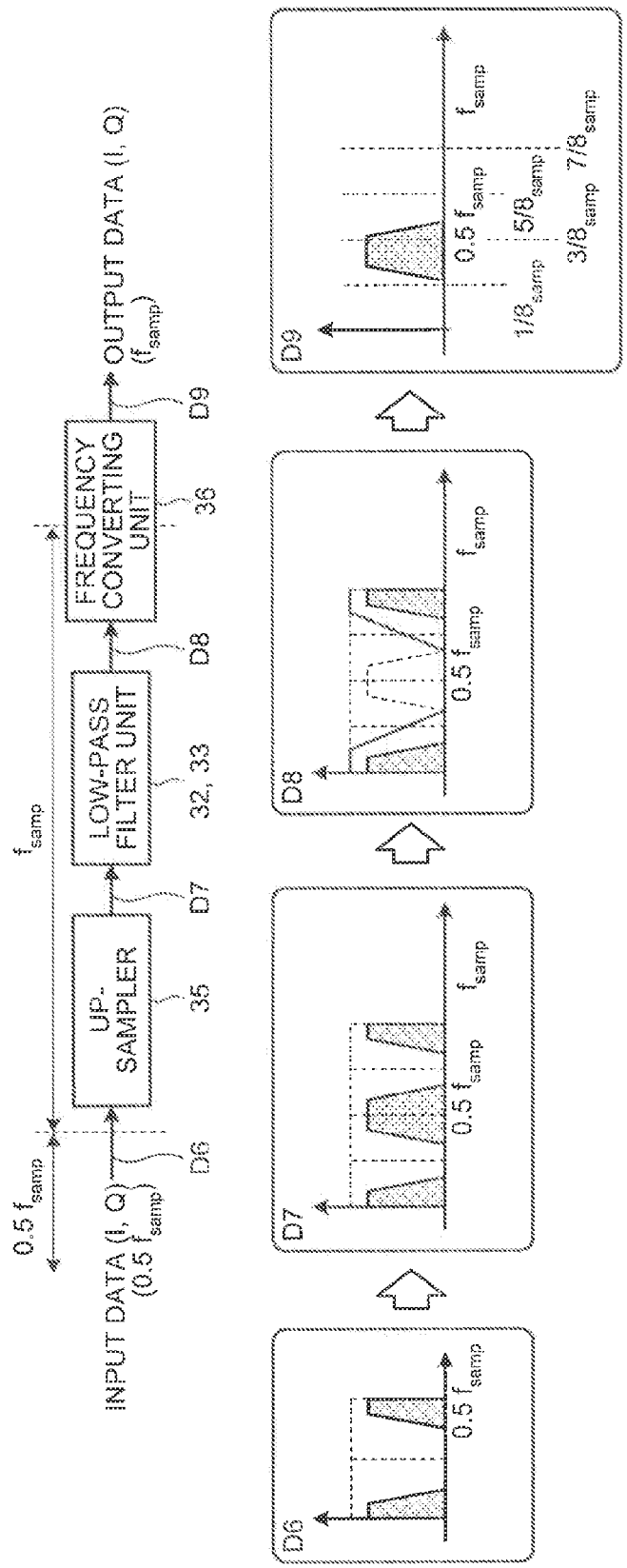
FIG. 7 is a diagram of an operation example of the transmission-low-pass filter/frequency converting unit.

The operation of the transmission low-pass filter/frequency converting unit 23-$i$ is explained below. FIG. 7 is a diagram of an operation example of the transmission low-pass filter/frequency converting unit 23-$i$. The transmission low-pass filter/frequency converting unit 23-$i$ offsets a center frequency of an input signal to an arbitrary value while interpolating a sampling frequency (=0.5 $f_{SAMP}$) of the input signal to a double (=1.0 $f_{SAMP}$).

For example, the up-sampler 35 up-samples data D6 input from the transmission-waveform shaping filter 21 to a double rate and changes the data D6 to data D7. The low-pass filter unit (in-phase side) 32 and the low-pass filter unit (quadrature side) 33 remove an image component from the data D7 and change the data D7 to data D8. The frequency converting unit 36 applies frequency conversion for offsetting to an arbitrary frequency to the data D8 and outputs the data D8 as data D9. It is assumed that, as in the low-pass filter unit (in-phase side) 32 and the low-pass filter unit (quadrature side) 33 of the frequency converting/reception-low-pass filter unit 12-$i$, predetermined frequency characteristics are respectively set in the low-pass filter unit (in-phase side) 32 and the low-pass filter unit (quadrature side) 33.

In the multiplexing processing in this embodiment, processing as a set of such up-sample processing, low-pass filter processing, and frequency conversion and addition processing for adding up a result of the processing with other signals (signals corresponding to other bands or signals of processing results of other transmission low-pass filter/frequency converting units) are repeated until a sampling frequency after the up-sample reaches a sampling frequency of the D/A 25.

Figure 8:
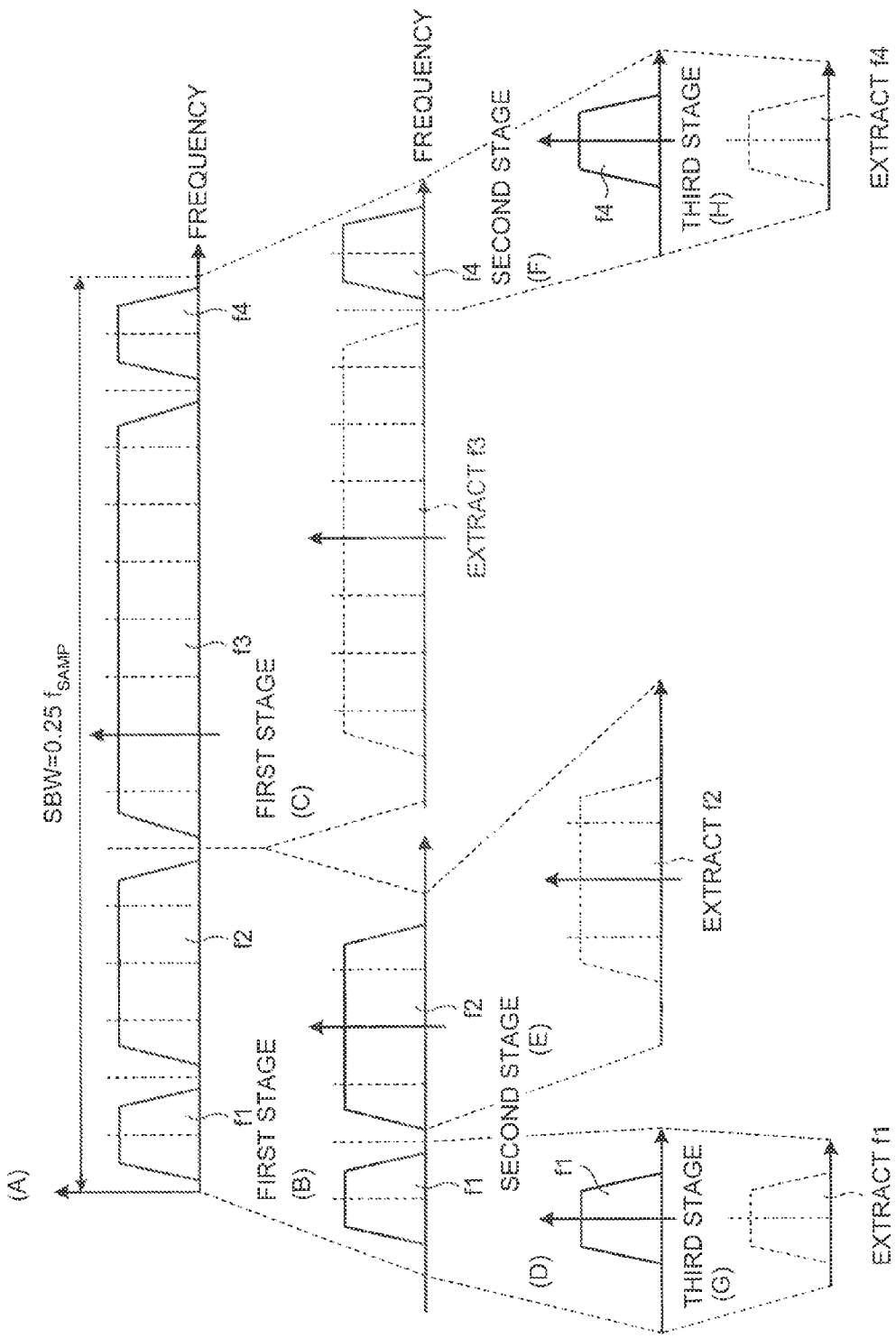
FIG. 8 is a diagram of a demultiplexing processing example in the first embodiment.
Figure 9:
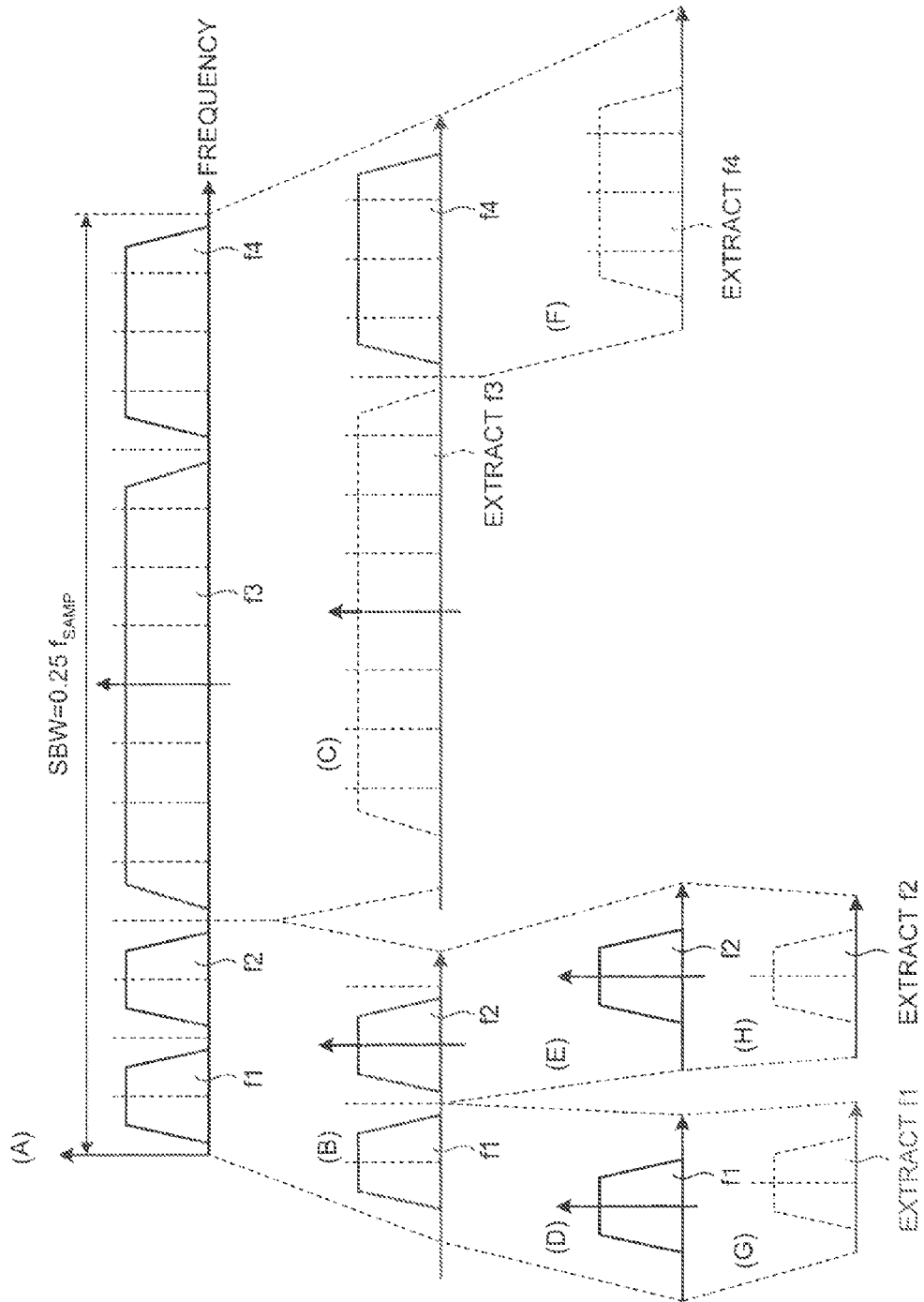
FIG. 9 is a diagram of a demultiplexing processing example in the first embodiment.
Figure 10:
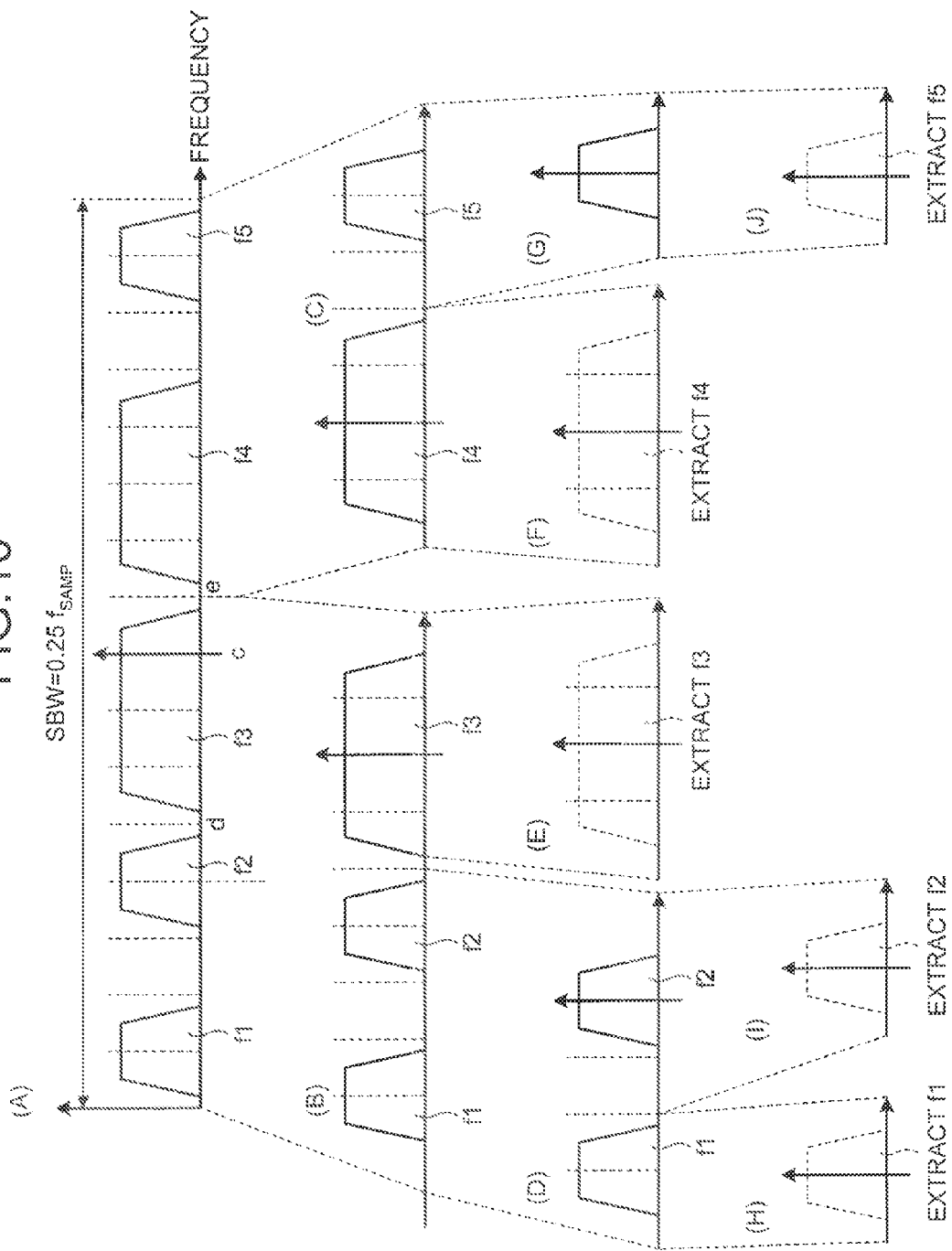
FIG. 10 is a diagram of a demultiplexing processing example of the first embodiment.

The overall operation in this embodiment is explained below. First, the demultiplexing operation is explained. Conditions explained below are assumed. A range in which a band signal of a demultiplexing target in a reception signal is included, i.e., a frequency band that can be used by a transmission side is represented as system band SBW and it is assumed that SBW is 0.25 $f_{SAMP}$. Before demultiplexing, a maximum of band widths of signals included in the system band SBW (=0.25 $f_{SAMP}$) is set to be equal to or smaller than a half of the system band SBW (=0.125 $f_{SAMP}$). FIGS. 8, 9, and 10 are diagrams of demultiplexing processing examples in this embodiment. (A) at the top of FIG. 8 indicates a reception signal before demultiplexing. For example, as shown in (A) of FIG. 8, when signals f1 to f4 having frequencies of the reception signal are present, band width of the signal f3 is the largest. However, the band width of the signal f3 is 0.5 SBW (=0.125 $f_{SAMP}$) and satisfies the condition explained above. Here, $f_{SAMP}$ is a sampling frequency of the A/D 11. The SBW is set to 0.25 $f_{SAMP}$. However, the SBW is not limited to this relation as long as the SBW is sampled at necessary rate generally used to correctly sample the SBW.

Figure 11:
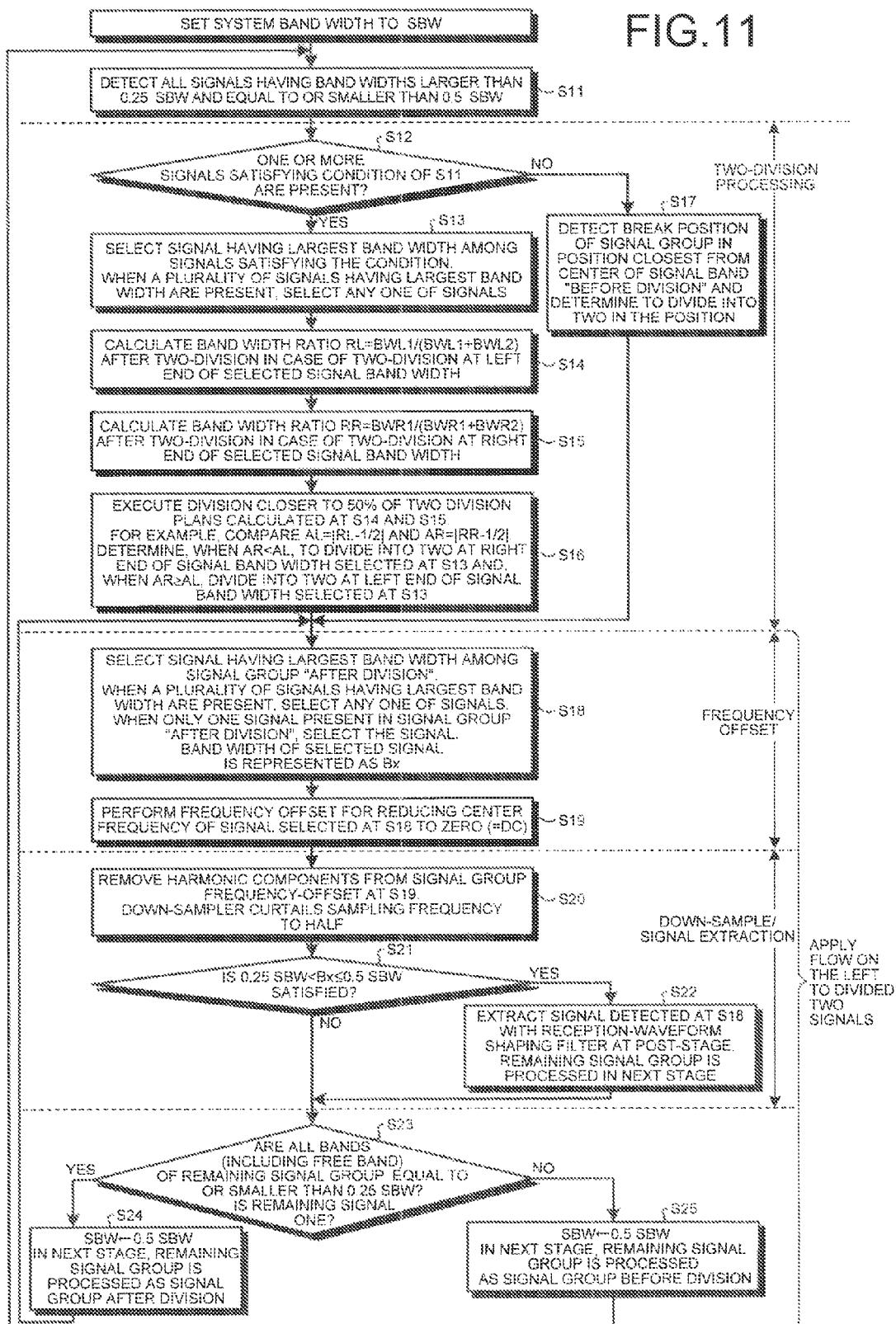
FIG. 11 is a flowchart for explaining an example of a demultiplexing processing procedure in the first embodiment.

The demultiplexing processing in this embodiment is performed according to a flow and rules of (1) to (11) explained below. This flow is repeated many times until all signals are demultiplexed and extracted. It is assumed that, every time this flow is repeated, the system band SBW is halved (SBW←0.5 SBW). FIG. 11 is a flowchart for explaining an example of a procedure of the demultiplexing processing in this embodiment. The demultiplexing processing in this embodiment is explained with reference to FIGS. 8 to 11.

As the flow of the demultiplexing processing, the reception-filter-bank control unit 2 controls implementation of the demultiplexing processing by applying two-division rules described in (1) to (5) below.

(1) Among a plurality of signals (=a signal group) present in a signal band before division, the reception-filter-bank control unit 2 detects all signals having band widths larger than 0.25 SBW and equal to or smaller than 0.5 SBW (step S11). The reception-filter-bank control unit 2 determines whether one or more signals satisfying the condition (signals having band widths larger than 0.25 SBW and equal to or smaller than 0.5 SBW) are present (step S12). When one or more signals satisfying the condition are present (Yes at step S12), the reception-filter-bank control unit 2 selects a signal having the largest band width among the detected signals (step S13). When two or more signals having the largest band width are present, the reception-filter-bank control unit 2 selects arbitrary one of the signals. On the other hand, when no signal satisfying the condition (signal having band width larger than 0.25 SBW and equal to or smaller than 0.5 SBW) is present (No at step S12), the reception-filter-bank control unit 2 proceeds to step S17 ((5) explained below)).

It is assumed that information concerning arrangement of frequency directions and band widths of signal groups is notified from a system including this demultiplexing apparatus to the reception-filter-bank control unit 2 as reception channel information (e.g., a reception apparatus including this demultiplexing apparatus obtains these kinds of information by exchanging the information with a transmitting apparatus and inputs the information to the demultiplexing apparatus).

(2) The reception-filter-bank control unit 2 calculates a band width ratio RL=BWL1/(BWL1+BWL2) after two-division in the case of two-division at the left end of the signal band width (a position where a frequency is the lowest in the band width) selected at step S13 (selected in (1) above) (step S14). BWL1 and BWL2 indicate band widths of divided signals in the case of two-division at the left end of the signal band width selected at step S13.

(3) The reception-filter-bank control unit 2 calculates a band width ratio RR=BWR1/(BWR1+BWR2) after two-division in the case of two-division at the right end of the signal band (a position where a frequency is the highest in the band width) selected at step S13 (selected in (1) above) (step S15). BWR1 and BWR2 indicate band widths of divided signals in the case of two-division at the right end of the signal band width selected at step S13.

(4) The reception-filter-bank control unit 2 instructs the corresponding frequency converting/reception-low-pass filter unit 12-*i* to divide an input signal (a reception signal) such that a division ratio is close to 50% (0.5) in RL and RR (step S16). For example, the reception-filter-bank control unit 2 compares AL=|RL−1/2| and AR=|RR−1/2|. When AR<AL, the reception-filter-bank control unit 2 divides the input signal into two at the right end of the signal band width selected at step S13. When AR≥AL, the reception-filter-bank control unit 2 divides the input signal at the left end of the signal band width selected at step S13. (The conditions AR<AL and AR≥AL can be respectively changed to AR≤AL and AR>AL).

(5) When no signal having band width larger than 0.25 SBW and equal to or smaller than 0.5 SBW is present among the signals present in the signal band before division (No at step S12), the reception-filter-bank control unit 2 detects a break of a signal group present in a position closest from the center of the signal band before division and instructs the corresponding frequency converting/reception-low-pass filter unit 12-*i* to divide the input signal into two in that position (step S17).

After the control to which the two-division rules are applied, the frequency converting unit 31 carries out frequency offset processing of (6) and (7) below.

(6) The reception-filter-bank control unit 2 selects a signal having largest band width among a signal group included in the respective input signals after division and represents the band width of the selected signal as Bx (step S18). When a plurality of signals having the largest band width are present, the reception-filter-bank control unit 2 selects arbitrary one of the signals. When one signal is included in the input signals after division, the reception-filter-bank control unit 2 selects the signal.

(7) The reception-filter-bank control unit 2 instructs the corresponding frequency converting/reception-low-pass filter unit 12-*i* to set an offset amount to set a center frequency of the band of the signal selected at step S18 (selected in (6) above) to zero. The frequency converting unit 31 of the instructed frequency converting/reception-low-pass filter unit 12-*i* applies, based on the instruction, frequency offset to the input signals (step S19).

In the above explanation, the reception-filter-bank control unit 2 calculates an amount of frequency offset. However, the frequency converting unit 31 can acquire reception channel information and a dividing position from the input signal and the reception-filter-bank control unit 2 and perform all the kinds of processing of (6) and (7).

The reception-filter-bank control unit 2 carries out processing of down-sample and signal extraction according to rules of down-sample and signal extraction described in (8) to (11) below.

(8) The low-pass filter unit (in-phase side) 32 and the low-pass filter unit (quadrature side) 33 set, based on an instruction from the reception-filter-bank control unit 2, frequency characteristics of filters and remove a harmonic component from the input signals frequency-offset at step S19 ((7) above). The down-sampler 34 curtails the signals after the removal of the harmonic component to halve a sampling frequency (step S20).

(9) The reception-filter-bank control unit 2 compares the band width Bx of the signal selected at step S18 ((6) above) with the system band SBW and determines whether 0.25 SBW<Bx≤0.5 SBW is satisfied (step S21). When this condition is satisfied (Yes at step S21), the reception-filter-bank control unit 2 transmits, to the reception selector 13, a reception selection signal for instructing the reception selector 13 to output, to the post-stage, a signal obtained by applying the processing at step S19 (the down-sample and the signal extraction) to the signal selected at step S18 (hereinafter referred to as division end signal). The reception selector 13 selects, based on the reception selection signal, an output of the frequency converting/reception-low-pass filter unit 12-*i* corresponding to the division end signal and sends the selected output signal to the reception-waveform shaping filter 14. The reception-waveform shaping filter 14 extracts the output signal (step S22). A remaining signal group other than the division end signal is output to the frequency converting/reception-low-pass filter unit 12-*i* in the next stage and processing in the next stage is carried out (step S22).

(10) When 0.25 SBW<Bx≤0.5 SBW is not satisfied (No at step S21), the divided input signals including all signal groups as well as the signal selected at step S18 (selected in (6) above) are output to the frequency converting/reception-low-pass filter unit 12-*i* in the next stage.

As the demultiplexing processing in the next stage, the reception-filter-bank control unit 2 carries out steps S11 to S22 ((1) to (10) above) again. In carrying out the steps, the reception-filter-bank control unit 2 determines whether all bands of the remaining signal group (signals in bands other than the division end signal) (band widths between a lowest frequency and a highest frequency of the remaining signal group: including a free band) are equal to or smaller than 0.25 SBW or whether one signal remains (step S23). When all the bands are equal to or smaller than 0.25 SBW or one signal remains (Yes at step S23), the reception-filter-bank control unit 2 sets the remaining signal as the division end signal without carrying out the division processing in the next stage (step S24), returns to step S18, and carries out the processing at step S18 and subsequent steps. When not all the bands are equal to or smaller than 0.25 SBW or two or more signals remain (No at step S23), the reception-filter-bank control unit 2 sets the remaining signals as pre-division signals (step S25), returns to step S11, and carries out the processing at step S11 and subsequent steps again. In carrying out the processing again, as explained above, the reception-filter-bank control unit 2 resets the SBW to a half value (SBW=½×SBW) and performs the processing.

The demultiplexing processing of the flow is explained below with reference to a specific example. FIGS. 8 to 10 are diagrams of three cases in which signals included in a reception signal are different. First, an example shown in FIG. 8 is explained. In the example shown in FIG. 8, as shown in (A) at the top, it is assumed that band signals f1 to f4 are included in an input signal (a reception signal) in the system band SBW. The SBW is a quarter of the A/D sampling frequency fSAMP. In the example shown in FIG. 8, a band of the band signal f3 is equal to or larger than 0.5 SBW.

First, as demultiplexing processing in a first stage (processing by the frequency converting/reception-low-pass filter units 12-1 and 12-2), processing for dividing the input signal into two is performed. Because a band of the band signal f3 is equal to or larger than 0.5 SBW, the band signal f3 is detected at step S11. Because bands of the band signals other than the band signal f3 is smaller than 0.5 SBW, the band signal f3 is selected at step S13. Therefore, a candidate of a dividing position of first two-division (in the first stage)) is a left end (a) or a right end (b) in (A) of the figure.

When the input signal is divided at the left end (a), RL=⅜ and AL=⅛. When the input signal is divided at the right end (b), RR=⅞ and AR=⅜. Therefore, as it is evident from FIG. 8(A), AR>AL. At step S16, division at the left end (a) is carried out. Therefore, the reception-filter-bank control unit 2 instructs the frequency converting/reception-low-pass filter units 12-1 and 12-2 to perform division at the left end (a). It is assumed that information concerning arrangement of frequency directions of the band signals f1 to f4 and band widths is input to the reception-filter-bank control unit 2 in advance as reception channel information.

The frequency converting/reception-low-pass filter units 12-1 and 12-2 carry out, based on the instruction from the reception-filter-bank control unit 2, the processing of frequency conversion, down-sampling, and signal extraction (steps S18 to S20 explained above). According to this division, the input signal is divided into two signals shown in (B) and (C) of FIG. 8.

Specifically, the reception-filter-bank control unit 2 instructs, according to the rules of frequency offset explained in (6) and (7) above, the frequency converting/reception-low-pass filter unit 12-1 about a frequency setting value for setting a center frequency of the band signal f2 having a wider band of the band signals f1 and f2 included in a signal on a low-frequency side (hereinafter referred to as low-frequency divided signal) among signals to be divided to zero (setting a position indicated by a vertical arrow of (B) of FIG. 8 to zero).

The reception-filter-bank control unit 2 instructs, according to the rules of frequency offset explained in (6) and (7) above, the frequency converting/reception-low-pass filter unit 12-2 about a frequency setting value for setting a center frequency of the band signal f3 having a wider band of the band signals f3 and f4 included in a signal on a high-frequency side (hereinafter referred to as high-frequency divided signal) among signals to be divided to zero (setting a position indicated by a vertical arrow of (C) of FIG. 8 to zero).

The frequency converting/reception-low-pass filter units 12-1 and 12-2 respectively apply, based on the frequency setting values instructed from the reception-filter-bank control unit 2, frequency conversion processing to the low-frequency divided signal and the high-frequency divided signal. The low-pass filter unit (in-phase side) 32 and the low-pass filter unit (quadrature side) 33 remove high-frequency components from the signals after frequency conversion. The down-sampler 34 down-samples a sampling frequency of the signals, from which the high-frequency components are removed, to a half.

As processing at step S21, the band width Bx of the extracted signal is calculated. Bx is band width B3 of the band signal f3 and B3 satisfies 0.25 SBW<B≤0.5 SBW. Therefore, according to the rules of signal extraction, the high-frequency divided signal processed by the frequency converting/reception-low-pass filter unit 12-2 is output to the reception-waveform shaping filter 14. The reception-waveform shaping filter 14 extracts the band signal f3 from the signal. The signals other than the band signal f3 (corresponding to frequency components obtained by removing the band signal f3 from entire (B) and (C) of FIG. 8) do not satisfy 0.25 SBW<B≤0.5 SBW. Therefore, the signals are output to processing in the next stage (a second stage).

In the second stage (corresponding to the frequency converting/reception-low-pass filter units 12-3 to 12-6), the SBW in the first stage is updated to 0.5×SBW and processing same as that in the first stage is performed.

Specifically, the reception-filter-bank control unit 2 determines a position where the low-frequency divided signal (FIG. 8(B)) divided in the first stage is further divided into two. The band widths of both the band signals f1 and f2 included in the low-frequency divided signal are smaller than 0.5×SBW. Therefore, as a break position present in a position closest from the center of a signal band of the low-frequency divided signal, a position between the band signal f1 and the band signal f2 is determined. The frequency converting/reception-low-pass filter units 12-3 and 12-4, to which the low-frequency divided signal output by the frequency converting/reception-low-pass filter unit 12-1 is output, are instructed to divide the low-frequency divided signal ((D) and (E) of FIG. 8)).

Specifically, concerning a divided signal on a low-frequency side obtained by dividing the low-frequency divided signal (hereinafter referred to as low-frequency side low-frequency divided signal), the reception-filter-bank control unit 2 calculates, according to the rules of frequency offset, a frequency setting value for setting the center frequency of the band signal f1 to zero and instructs the frequency converting/reception-low-pass filter unit 12-3 about the frequency setting value. The frequency converting/reception-low-pass filter unit 12-3 applies, based on the instruction, the processing of frequency conversion, removal of high-frequency components, and down-sample to the low-frequency side low-frequency divided signal ((D) of FIG. 8).

Concerning a divided signal on a high-frequency side obtained by dividing the low-frequency divided signal (hereinafter referred to as high-frequency side low-frequency divided signal), the reception-filter-bank control unit 2 calculates, according to the rules of frequency offset, a frequency setting value for setting the center frequency of the band signal f2 to zero and instructs the frequency converting/reception-low-pass filter unit 12-4 about the frequency setting value. The frequency converting/reception-low-pass filter unit 12-4 applies, based on the instruction, the processing of frequency conversion, removal of high-frequency components, and down-sample to the high-frequency side low-frequency divided signal ((E) of FIG. 8). Concerning the low-frequency divided signal, the frequency conversion is carried out to set the center of f2 to zero in the first stage. Therefore, actually, frequency conversion processing is not performed.

The signal processed by the frequency converting/reception-low-pass filter unit 12-4 includes the band signal f2. The band width B2 of the band signal f2 satisfies 0.25 SBW<B2≤0.5 SBW. Therefore, according to the rules of signal extraction, the high-frequency side low-frequency divided signal processed by the frequency converting/reception-low-pass filter unit 12-4 is output to the reception-waveform shaping filter 14. The reception-waveform shaping filter 14 extracts the band signal f2 from the signal.

On the other hand, the reception-filter-bank control unit 2 detects a position where the high-frequency divided signal is divided. However, the band signal f3 is already extracted. Because the remaining signal is only the band signal f4, the reception-filter-bank control unit 2 does not carry out the division. The reception-filter-bank control unit 2 instructs, according to the rules of frequency offset, the frequency converting/reception-low-pass filter unit 12-5 to set the center frequency of the band signal f4 to zero. The frequency converting/reception-low-pass filter unit 12-5 carries out, based on the instruction, frequency conversion and performs processing of removal of high-frequency components and down-sampling.

Both the band signal f1 included in the signal after the processing by the frequency converting/reception-low-pass filter unit 12-4 and the band signal f4 included in the signal after the processing by the frequency converting/reception-low-pass filter unit 12-5 do not satisfy 0.25 BSW<Bx≤0.5 BSW. Therefore, the signal after the processing by the frequency converting/reception-low-pass filter unit 12-4 and the signal after the processing by the frequency converting/reception-low-pass filter unit 12-5 are input to a third stage.

In the third stage, the second stage SBW is updated to SBW×0.5 (when the SBW in the first stage is set as a reference, a value of a quarter of the reference) and processing same as that in the first and second stages is performed.

Specifically, first, concerning the signal after the processing by the frequency converting/reception-low-pass filter unit 12-4 and the signal after the processing by the frequency converting/reception-low-pass filter unit 12-5 (corresponding to FIG. 8(D) and FIG. 8(F)), the reception-filter-bank control unit 2 detects positions for dividing respective signal groups into two. However, only one signal remains as each of the signals after the processing (the band signal f1 and the band signal f4). Therefore, the reception-filter-bank control unit 2 does not perform division control (processing in the case of Yes at step S23) and handles the signals as signals after division.

The signal after the processing by the frequency converting/reception-low-pass filter unit 12-4 is output to the frequency converting/reception-low-pass filter unit 12-7. The signal after the processing by the frequency converting/reception-low-pass filter unit 12-5 is output to the frequency converting/reception-low-pass filter unit 12-14.

Concerning the signal after the processing by the frequency converting/reception-low-pass filter unit 12-4, the reception-filter-bank control unit 2 calculates, according to the rules of frequency offset, a frequency setting value for setting the center frequency of the band signal f1 to zero and instructs the frequency converting/reception-low-pass filter unit 12-7 about the frequency setting value. The frequency converting/reception-low-pass filter unit 12-7 carries out, based on the instruction, frequency conversion, removal of high-frequency components, and down-sampling. However, the center frequency of the band signal f1 is already frequency-converted to be zero in the second stage. Therefore, actually, the frequency conversion is not performed in the third stage.

Similarly, concerning the signal after the processing by the frequency converting/reception-low-pass filter unit 12-5, the reception-filter-bank control unit 2 calculates, according to the rules of frequency offset, a frequency setting value for setting the center frequency of the band signal f4 to zero and instructs the frequency converting/reception-low-pass filter unit 12-14 about the frequency setting value. The frequency converting/reception-low-pass filter unit 12-14 carries out, based on the instruction, frequency conversion, removal of high-frequency components, and down-sampling. However, the center frequency of the band signal f4 is already frequency-converted to be zero in the second stage. Therefore, actually, the frequency conversion is not performed in the third stage.

The band B1 of the band signal f1 included in the signal after the processing by the frequency converting/reception-low-pass filter unit 12-7 satisfies 0.25 SBW<B1≤0.5 SBW. Therefore, according to the rules of signal extraction, the signal processed by the frequency converting/reception-low-pass filter unit 12-7 is output to the reception-waveform shaping filter 14. The reception-waveform shaping filter 14 extracts the band signal f1 from the signal.

The band B4 of the band signal f4 included in the signal after the processing by the frequency converting/reception-low-pass filter unit 12-14 also satisfies 0.25 SBW<B4≤0.5 SBW. Therefore, according to the rules of signal extraction, the signal processed by the frequency converting/reception-low-pass filter unit 12-14 is output to the reception-waveform shaping filter 14. The reception-waveform shaping filter 14 extracts the band signal f4 from the signal.

In this way, in this embodiment, the reception-filter-bank control unit 2 carries out the demultiplexing processing using the frequency converting/reception-low-pass filter units 12-1 to 12-14 according to frequency positions and band widths of the band signals included in the reception signal. For each of the band signals, the reception selector 13 selects, based on an instruction of the reception-filter-bank control unit 2, a corresponding signal among outputs of the frequency converting/reception-low-pass filter units 12-1 to 12-14 and outputs the selected signal to processing at the post-stage as a demultiplexed signal. By performing such processing, demultiplexing of the signal group shown in FIG. 8(A), which cannot be realized by the related art, can be performed.

The reception-filter-bank control unit 2 controls the reception selector such that a demultiplexed band signal is supplied to the reception-waveform shaping filter 14.

An example shown in FIG. 9 is explained. The example shown in FIG. 9 is a case in which AR=AL. As shown in (A) of FIG. 9, in this example, it is assumed that the band signals f1 to f4 are included in a reception signal and the band width of the band signal f3 is 0.5 SBW. In this case, at step S13, the band signal f3 is selected. On the other hand, when RR, AR, RL, and AL are calculated concerning the band signal f3, RR=6/8, AR=2/8, RL=2/8, and AL=2/8. Because AR=AL, the reception signal can be divided either at the left end or the right end of the band signal f3. Whichever of the division at the left end or the division at the right end can be selected. However, in FIG. 9, an operation example performed when it is selected to divide the received signal into two at the left end is shown.

In this case, a signal group is divided into two at a ratio of 2:6 (a ratio of (B) and (C) of FIG. 9). Thereafter, demultiplexing processing in the respective stages is carried out in the same manner as explained with reference to FIG. 8. Specifically, first, in the first stage, a low-frequency divided signal shown in FIG. 9(B) including the band signals f1 and f2 is frequency-converted to set the center frequency of the band signal f2 to zero and subjected to low-pass filter processing and down-sample processing. A high-frequency divided signal shown in FIG. 9(C) is frequency-converted to set the center frequency of the band signal f3 to zero and subjected to low-pass filter processing and down-sample processing. The band width of the band signal f3 is equal to or larger than 0.5×SBW. Therefore, the process does not proceed to the next stage and is output to the reception-waveform shaping filter 14.

In the second stage, the low-frequency divided signal shown in FIG. 9(B) is divided into a signal including the band signal f1 (FIG. 9(D)) and a signal including the band signal f2 (FIG. 9(E)). The signal including the band signal f1 is frequency-converted to set the center frequency of the band signal f1 to zero and subjected to low-pass filter processing and down-sample processing. The signal including the band signal f2 is frequency-converted to set the center frequency of the band signal f2 to zero and subjected to low-pass filter processing and down-sample processing. Because the band signal f3 is extracted after the processing in the first stage, the high-frequency divided signal shown in FIG. 9(C) includes only the band signal f4. Therefore, the high-frequency divided signal is not subjected to division processing and is frequency-converted to set the center frequency of the band signal f4 to zero and subjected to low-pass filter processing and down-sample processing.

The band width of the band signal f4 is equal to or larger than 0.5×SBW. Therefore, the band signal f4 does not proceed to the next stage and is output to the reception-waveform shaping filter 14.

The band widths of the band signals f1 and f2 are smaller than 0.5×SBW. Therefore, the signal shown in (D) of FIG. 9 and the signal shown in (E) of FIG. 9 are output to processing in a third stage. In the third stage, each of the band signals f1 and f2 is subjected to low-pass filter processing and down-sample processing and output to the reception-waveform shaping filter 14. Because the operation of the demultiplexing processing is explained with reference to FIG. 8, explanation of processing same as that shown in FIG. 8 is simplified in explanation of operation shown in FIG. 9.

An example shown in FIG. 10 is explained below. In the example shown in FIG. 10, none of the band signals f1 to f5 included in a reception signal satisfies a condition that band width is larger than 0.25 SBW and equal to or smaller than 0.5 SBW.

First, as it is seen from FIG. 10(A), all band widths of the band signals f1, f2, and f5 are 0.125×SBW and band widths of the band signals f3 and f4 are 0.25×SBW. Therefore, in a signal group shown in FIG. 10(A), a band signal having band width larger than 0.25×SBW and equal to or smaller than 0.5×SBW is not present.

In this case, the reception-filter-bank control unit 2 detects a break position of a band signal in a position closest from the center of a signal band before division (a position c in FIG. 10(A)) and divides the signal in the position.

In the example shown in FIG. 10, the right end (a position e in FIG. 10(A)) and the left end (a position d in FIG. 10(A)) of the signal f3 are candidates of the break position of the band signal. However, when a distance between the position d and the position c and a distance between the position e and the position c are compared, the distance between the position c and the position e is clearly smaller. Therefore, the reception-filter-bank control unit 2 performs control to divide the reception signal into two at the right end of the band signal f3. As processing after that, the demultiplexing processing is performed according to the flow and the rules of demultiplexing described in the same manner as those shown in FIGS. 8 and 9.

Specifically, in the first stage, the frequency converting/reception-low-pass filter unit 12-1, which extracts a frequency on a low-frequency side, applies, based on an instruction of the reception-filter-bank control unit 2, frequency conversion to the input signal to offset the center frequency of the band signal f3 having the largest band width among band signals included in a signal on a low-frequency side (FIG. 10(B)) after being divided into two in the position c to zero and then applies low-pass filter processing and down-sampling processing to the input signal. Similarly, the frequency converting/reception-low-pass filter unit 12-2, which extracts a frequency on a high-frequency side, applies, based on an instruction of the reception-filter-bank control unit 2, frequency conversion to the input signal to offset the center frequency of the band signal f4 having the largest band width among band signals included in a signal on a high-frequency side (FIG. 10(C)) after being divided into two in the position c to zero and then applies low-pass filter processing and down-sampling processing to the input signal. In this example, none of the band widths of the band signals f1 to f5 satisfies a condition that band width is larger than 0.25×SBW and equal to or smaller than 0.5×SBW. Therefore, no signal is output to the reception-waveform shaping filter 14. All the signals are sent to processing in the second stage.

In the second stage, a band of the band signal f3 included in the low-frequency divided signal is 0.5 SBW. Therefore, the band signal f3 is selected as a band signal, a band of which is larger than 0.25 SBW and equal to or smaller than 0.5 SBW. Division is carried out at the left end of the band signal f3 (FIGS. 10(D) and (E)). The band signal f3 is output to the reception-waveform shaping filter 14.

In the second stage, a band of the band signal f4 included in the high-frequency divided signal is 0.5 SBW. Therefore, the band signal f4 is selected as a band signal, a band of which is larger than 0.25 SBW and equal to or smaller than 0.5 SBW. Division is carried out at the right end of the band signal f4 (FIGS. 10(F) and (G)). The band signal f4 is output to the reception-waveform shaping filter 14. Signals including the remaining band signals f1, f2, and f5 that are not output to the reception-waveform shaping filter 14 are sent to the third stage.

In the third stage, a band of a signal including the band signals f1 and f2 is 0.5 SBW. Therefore, the signal is divided in a dividing position at the right end of the band signal f1 or the left end of the band signal f2 (FIGS. 10(H) and (I)). The band signals f1 and f2 are output to the reception-waveform shaping filter 14. Other band signals are not present in a signal including the band signal f5. Therefore, division is not performed and processing of frequency conversion for setting a center frequency of the band signal f5 to zero and subsequent processing are carried out (FIG. 10(J)). The band signal f5 is output to the reception-waveform shaping filter 14. Because the operation of the demultiplexing processing is explained with reference to FIG. 8, explanation of processing same as that shown in FIG. 8 is simplified in the explanation of the operation shown in FIG. 10.

The demultiplexing apparatus according to this embodiment includes fourteen frequency converting/reception-low-pass filter units. However, for example, in the demultiplexing processing explained in the example shown in FIG. 8, the frequency converting/reception-low-pass filter unit 12-5 in the second stage and the frequency converting/reception-low-pass filter units 12-8 to 12-13 in the third stage are not used among the frequency converting/reception-low-pass filter units. Similarly, in the example shown in FIG. 9 and the example shown in FIG. 10, the frequency converting/reception-low-pass filter units not in use are present.

Therefore, in this embodiment, to reduce power consumption, supply of a clock signal to the frequency converting/reception-low-pass filter units not in use is stopped. Specifically, the reception-filter-bank control unit 2 specifies, based on reception channel information, the frequency converting/reception-low-pass filter units not used for processing of a reception signal as a processing target. The reception-filter-bank control unit 2 instructs (sends a clock control signal to) the clock supplying unit 3 to stop a clock signal supplied to the frequency converting/reception-low-pass filter unit not in use.

Usually, the clock supplying unit 3 supplies a clock signal to all the components shown in FIG. 1. However, when the clock supplying unit 3 receives the clock control signal from the reception-filter-bank control unit 2, the clock supplying unit 3 stops, based on the clock control signal, the supply of the clock signal to the frequency converting/reception-low-pass filter units not in use.

On the other hand, in this embodiment, the reception-waveform shaping filter 14 and the demodulating unit 4 have an internal configuration for allowing maximum eight demodulating operations, i.e., a configuration capable of simultaneously processing maximum eight signals such that demultiplexing can be applied to a signal in which band signals are continuously included in a minimum unit band (a minimum unit of frequency band width that can be demultiplexed in this demultiplexing apparatus). On the other hand, in the example shown in FIG. 8, because the processing is applied to the four band signals f1 to f4, it is conceivable that not all internal circuits of the reception-waveform shaping filter 14 and the demodulating unit 4 are necessarily used.

Therefore, for further reduction of power consumption, the clock supplying unit 3 carries out, based on the clock control signal from the reception-filter-band control unit 2, stop of clock signal supply not only to the frequency converting/reception-low-pass filter units not in use but also to circuits not in use inside the reception-waveform shaping filter 14 and the demodulating unit 4. For example, the clock supplying unit 3 grasps in advance correspondence between outputs of the frequency converting/reception-low-pass filter units and the circuits inside the reception-waveform shaping filter 14 and the demodulating unit 4, to thereby store correspondence between the clock control signal and the circuits inside the reception-waveform shaping filter 14 and the demodulating unit 4 to which clock supply should be stopped. The reception-filter-bank control unit 2 can instruct, using the clock control signal, the clock supplying unit 3 about the circuits inside the reception-waveform shaping filter 14 and the demodulating unit 4, clock supply to which should be stopped.

In FIG. 8, the demultiplexing processing for the four band signals f1 to f4 is shown. However, for example, when the band signals f3 and f4 among the band signals are not present, the demultiplexing processing is applied to the two band signals f1 and f2 and circuits not in use increase. Therefore, sections, supply of the clock signal to which can be stopped, increases and power consumption can be reduced. In other words, the demultiplexing apparatus according to this embodiment can reduce power consumption in proportion to band widths of a signal group included in a reception signal to be processed.

Figure 12:
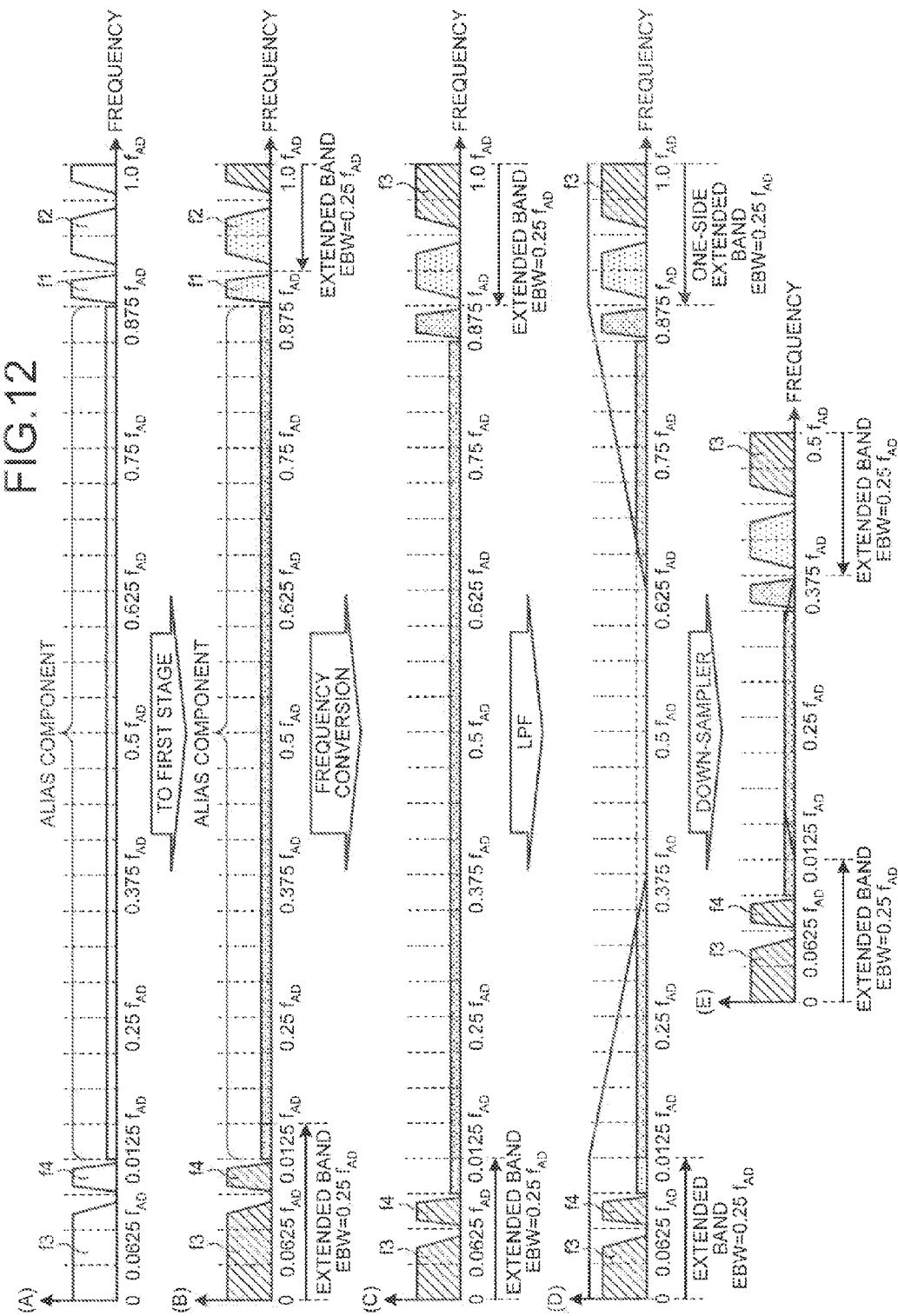
FIG. 12 is a diagram of processing carried out by a frequency converting/reception-low-pass filter unit in a first stage shown on a frequency axis.

Details of the operation in this embodiment are explained with reference to FIGS. 12 to 16 using the frequency arrangement shown in FIG. 8 as an example. FIG. 12 is a diagram of processing carried out by the frequency converting/reception-low-pass filter unit 12-2 in the first stage shown in a frequency axis. A signal spectrum after the A/D 11 baseband-samples the signal including the band signals shown in (A) of FIG. 8 is shown at the top (A) of FIG. 12. In FIG. 12, a sampling frequency of the A/D 11 is represented as $f_{AD}$. A relation between $f_{AD}$ and $f_{SAMP}$ is $f_{SAMP}=f_{AD}$. As shown in the figure at the top of FIG. 12, a signal having a negative frequency in FIG. 8(A) (in FIG. 8(A), a vertical arrow near the center indicates a position of a frequency 0) is present in a position of a frequency 0.875 $f_{AD}$ to 1.0 $f_{AD}$ in the figure at the top of FIG. 12 by being sampled by the A/D 11.

Among the four band signals f1 to f4, the frequency converting/reception-low-pass filter unit 12-2 sets, as targets to be allowed to pass by filtering, the signals on the high-frequency side divided in the first stage, i.e., the band signals f3 and f4 indicated by hatching in (B) second from the top in FIG. 12.

First, as explained above, the frequency converting unit 31 performs, based on an instruction of the reception-filter-bank control unit 2, frequency conversion to set the center frequency of the band signal f3 to zero ((C) third from the top of FIG. 12). A frequency range (a passing range) in which the low-pass filter unit (in-phase side) 32 and the low-pass filter unit (quadrature side) 33 at the post-stage allow frequencies to pass in this case is represented as extended band EBW and indicated by a range using an arrow in the figure. In the figure, a signal spectrum outside the extended band is indicated by filling of a light color. The extended band width EBW can be represented by a relation EBW=SBW with respect to the system band width SBW. A relation with the number of stages [stage] is $EBW=f_{AD}/2^{(Stage+1)}$. For example, in the first stage (the number of stages=1), $EBW=f_{AD}/2^2=0.25 \times f_{AD}$.

(D) fourth from the top of FIG. 12 indicates a spectrum after passage through the low-pass filter unit (in-phase side) 32 and the low-pass filter unit (quadrature side) 33. A thick line indicates a frequency characteristic of the low-pass filters. As it is seen from (D) of FIG. 12, the low-pass filter unit (in-phase side) 32 and the low-pass filter unit (quadrature side) 33 allow signal components in a region of frequency bands 0 to 0.125 $f_{AD}$ and 0.875 $f_{AD}$ to 1.0 $f_{AD}$ to pass and completely remove signal components in a region of frequency bands 0.375 $f_{AD}$ to 0.625 $f_{AD}$. Therefore, even if down-sampling for curtailing a sampling frequency to a half is performed after this, an alias component does not overlap the extended band. A spectrum after down-sample shown in (E) fifth from the top of FIG. 12 is obtained.

Figure 13:
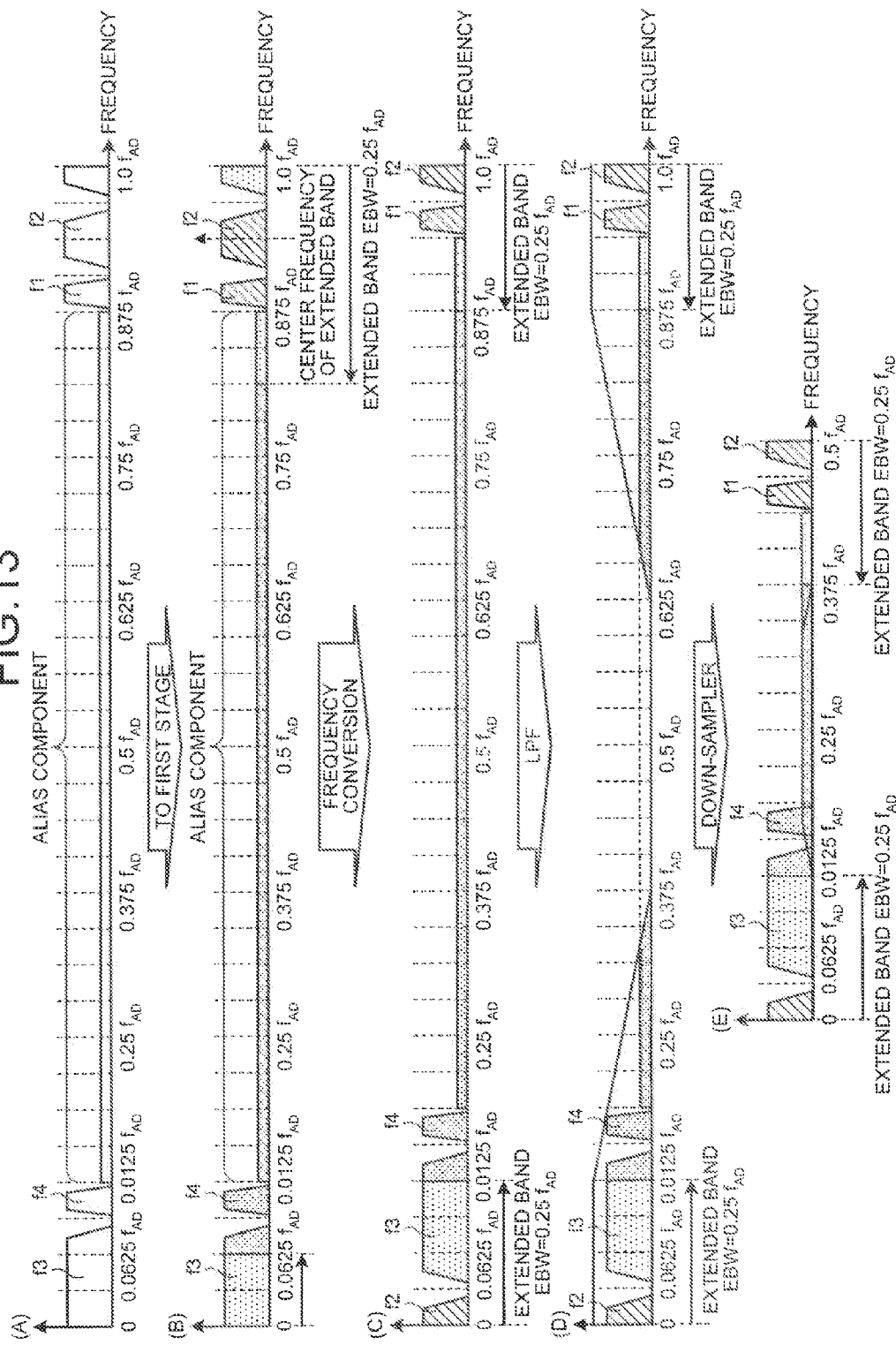
FIG. 13 is a diagram of processing carried out by the frequency converting/reception-low-pass filter unit in the first stage shown on the frequency axis.

FIG. 13 is a diagram of processing carried out by the frequency converting/reception-low-pass filter unit 12-1 in the first stage shown on the frequency axis. Among the four band signals f1 to f4 shown in (A) of FIG. 8, the frequency converting/reception-low-pass filter unit 12-1 sets, as targets to be allowed to pass by filtering, the signals on the low-frequency side divided in the first stage, i.e., the band signals f1 and f2 indicated by hatching in (B) second from the top of FIG. 13.

First, as explained above, the frequency converting unit 31 performs, based on an instruction of the reception-filter-bank control unit 2, frequency conversion to set the center frequency of the band signal f2 to zero ((C) third from the top of FIG. 13).

(D) fourth from the top of FIG. 13 indicates a spectrum after passage through the low-pass filter unit (in-phase side) 32 and the low-pass filter unit (quadrature side) 33. A thick line indicates a frequency characteristic of the low-pass filters. As it is seen from (D) of FIG. 13, the low-pass filter unit (in-phase side) 32 and the low-pass filter unit (quadrature side) 33 allow signal components in a region of frequency bands 0 to 0.125 $f_{AD}$ and 0.875 $f_{AD}$ to 1.0 $f_{AD}$ to pass and completely remove signal components in a region of frequency bands 0.375 $f_{AD}$ to 0.625 $f_{AD}$. Therefore, even if down-sampling for curtailing a sampling frequency to a half is performed after this, an alias component does not overlap the extended band. A spectrum after down-sample shown in (E) fifth from the top of FIG. 13 is obtained.

Figure 14:
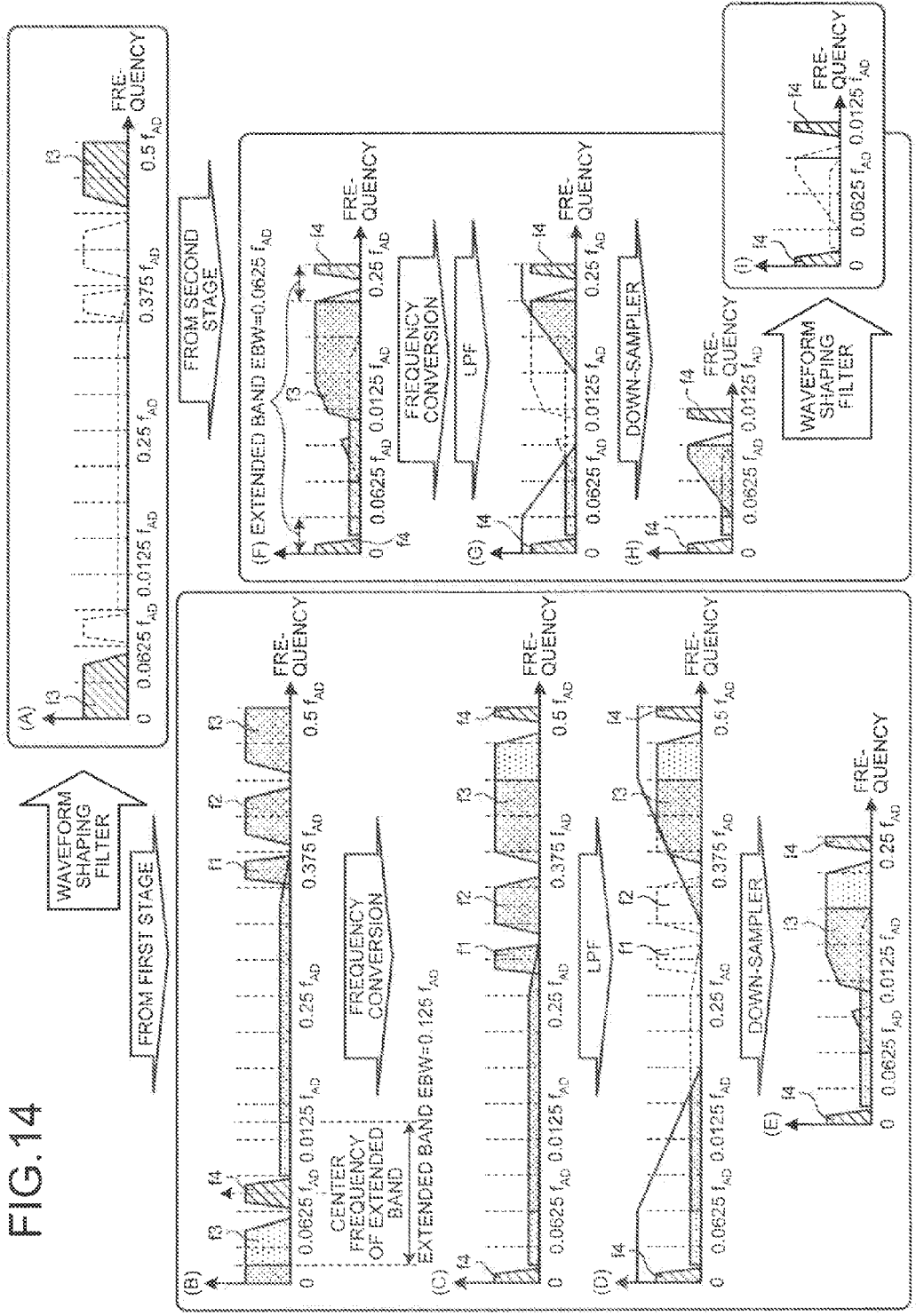
FIG. 14 is a diagram of processing carried out by a frequency converting/reception-low-pass filter unit in a second stage and a frequency converting/reception-low-pass filter unit and a reception-waveform shaping filter in a third stage shown on the frequency axis.

FIG. 14 is a diagram of processing carried out by the frequency converting/reception-low-pass filter unit 12-6 in the second stage and the frequency converting/reception-low-pass filter unit 12-4 and the reception-waveform shaping filter 14 in the third stage shown on the frequency axis. Among the four band signals f1 to f4 shown in (A) of FIG. 8, signals (signals including the band signals f3 and f4) after being processed by the frequency converting/reception-low-pass filter unit 12-2 are input to the frequency converting/reception-low-pass filter unit 12-6 in the second stage. However, the band signal f3 of the signals is extracted by the reception-waveform shaping filter 14.

A signal after the band signal f3 is extracted by the reception-waveform shaping filter 14 is shown in (A) at the top of FIG. 14. A thick line in (A) of FIG. 14 indicates a frequency characteristic of the waveform shaping filter. As it is seen from the figure, the reception-waveform shaping filter 14 extracts only the band signal f3 from data output from the frequency converting/reception-low-pass filter unit 12-2 and removes all remaining unnecessary waves.

(B) to (E) on the left of FIG. 14 indicate data processed by the frequency converting/reception-low-pass filter unit 12-6 in the second stage. (B) at the top on the left of FIG. 14 indicates a signal output from the frequency converting/reception-low-pass filter unit 12-2 in the first stage, i.e., an input signal to the frequency converting/reception-low-pass filter unit 12-6 in the second stage. The frequency converting/reception-low-pass filter unit 12-6 allows a region including the band signal f4 on the high-frequency side in the signal to pass.

First, the frequency converting unit of the frequency converting/reception-low-pass filter unit 12-6 frequency-converts, based on an instruction of the reception-filter-bank control unit 2, the center frequency of the band signal f4 to be zero ((C) second from the top on the left side of FIG. 14). Extended band width at this point is $EBW=f_{AD}/2^3=0.125 \times f_{AD}$.

(D) third from the top on the left side of FIG. 14 indicates a spectrum after passage through the low-pass filter unit (in-phase side) 32 and the low-pass filter unit (quadrature side) 33. A thick line indicates frequency characteristics of the low-pass filter unit (in-phase side) 32 and the low-pass filter unit (quadrature side) 33. As it is seen from the figure, as in the case of the first stage, the low-pass filter unit (in-phase side) 32 and the low-pass filter unit (quadrature side) 33 allow an extended band to pass and remove harmonics. Therefore, even if a sampling frequency is curtailed to a half, an alias component does not overlap the extended band. A spectrum after down-sample shown in (E) fourth from the top on the left side of FIG. 14 is obtained.

An output of the frequency converting/reception-low-pass filter unit 12-6 is input to processing in the third stage, i.e., the frequency converting/reception-low-pass filter unit 12-14 in the third stage. (F) at the top on the right side of FIG. 14 indicates a spectrum of a signal input to the frequency converting/reception-low-pass filter unit 12-14.

The frequency converting unit of the frequency converting/reception-low-pass filter unit 12-14 carries out, based on an instruction of the reception-filter-bank control unit 2, frequency conversion for this input signal to set the center frequency of the band signal f4 to zero. However, the center frequency of f4 is already frequency-converted to be zero in the second stage. Therefore, actually, the frequency conversion is not performed. Extended band width decreases to $EBW=f_{AD}/2^3=0.0625 \times f_{AD}$.

(G) second from the top on the right side of FIG. 14 indicates a spectrum after passage through the low-pass filter unit (in-phase side) 32 and the low-pass filter unit (quadrature side) 33. A thick line indicates frequency characteristics of the low-pass filter unit (in-phase side) 32 and the low-pass filter unit (quadrature side) 33. As it is seen from the figure, as in the case of the second stage, the low-pass filter unit (in-phase side) 32 and the low-pass filter unit (quadrature side) 33 allow an extended band to pass and remove harmonics. Therefore, even if a sampling frequency is curtailed to a half, an alias component does not overlap the extended band. A spectrum after down-sample shown in (H) third from the top on the right side of FIG. 14 is obtained. An output after the processing by the frequency converting/reception-low-pass filter unit 12-14 is output to the reception-waveform shaping filter 14.

(I) at the bottom on the right side of FIG. 14 indicates a spectrum after implementation of extraction processing for the band signal f4 by the reception-waveform shaping filter 14. A thick line indicates a frequency characteristic of the reception-waveform shaping filter 14. As it is seen from (I) of FIG. 14, the reception-waveform shaping filter 14 extracts only the band signal f4 from data output from the frequency converting/reception-low-pass filter unit 12-14 and removes all remaining unnecessary waves.

Figure 15:
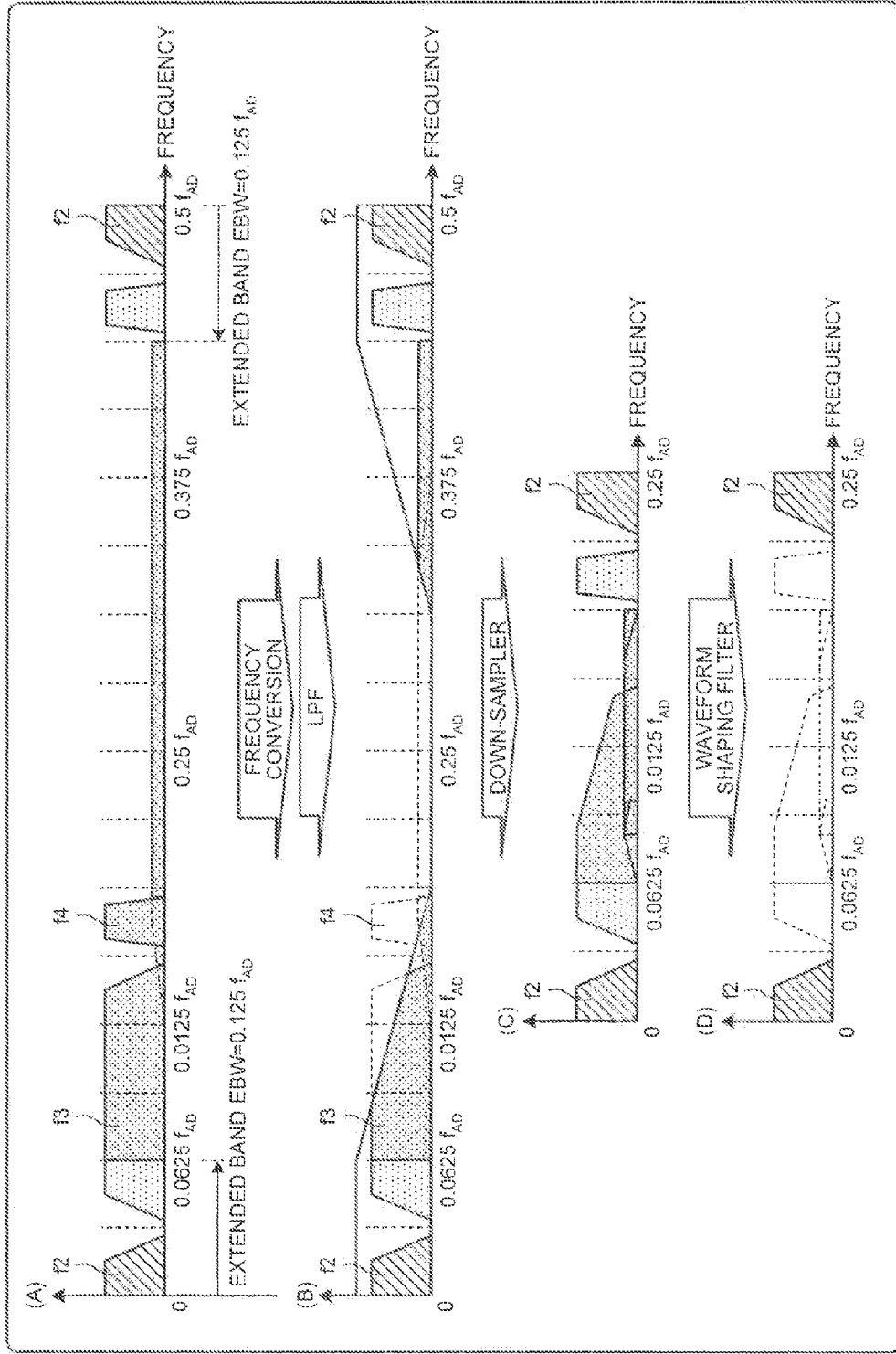
FIG. 15 is a diagram of processing carried out by the frequency converting/reception-low-pass filter unit and a reception-waveform shaping filter in the second stage shown on the frequency axis.

FIG. 15 is a diagram of processing carried out by the frequency converting/reception-low-pass filter unit 12-4 and the reception-waveform shaping filter 14 in the second stage shown on the frequency axis. Among the four band signals f1 to f4 shown in (A) of FIG. 8, signals (signals including the band signals f1 and f2) after being processed by the frequency converting/reception-low-pass filter unit 12-1 are input to the frequency converting/reception-low-pass filter unit 12-4. However, the frequency converting/reception-low-pass filter unit 12-4 sets the band signal f2 of the signals as a target to be allowed to pass.

(A) at the top of FIG. 15 indicates a signal input from the frequency converting/reception-low-pass filter unit 12-1. A hatched part indicates the band signal f2 set as the target to be allowed to pass. First, the frequency converting unit 31 of the frequency converting/reception-low-pass filter unit 12-4 frequency-converts, based on an instruction of the reception-filter-bank control unit 2, the center frequency of the band signal f2 to be zero. However, the center frequency of the band signal f2 is already frequency-converted to be zero in the first stage. Therefore, actually, the frequency conversion is not performed. Extended band width is $EBW=f_{AD}/2^2=0.125 \times f_{AD}$.

(B) second from the top of FIG. 15 indicates a spectrum after passage through the low-pass filter unit (in-phase side) 32 and the low-pass filter unit (quadrature side) 33. A thick line indicates frequency characteristics of the low-pass filter unit (in-phase side) 32 and the low-pass filter unit (quadrature side) 33. As it is seen from the figure, as in the case of the first stage, the low-pass filter unit (in-phase side) 32 and the low-pass filter unit (quadrature side) 33 allow an extended band to pass and remove harmonics. Therefore, even if a sampling frequency is curtailed to a half, an alias component does not overlap the extended band. A spectrum after down-sample shown in (C) third from the top of FIG. 15 is obtained. An output of the frequency converting/reception-low-pass filter unit 12-4 is input to the reception-waveform shaping filter 14.

(D) fourth from the top of FIG. 15 indicates a signal after the band signal f2 is extracted by the reception-waveform shaping filter 14. A thick line shown in (D) of FIG. 15 indicates a frequency characteristic of the reception-waveform shaping filter 14. As it is seen from the figure, the reception-waveform shaping filter 14 extracts only the band signal f2 from data output from the frequency converting/reception-low-pass filter unit 12-4 and removes all remaining unnecessary waves.

Figure 16:
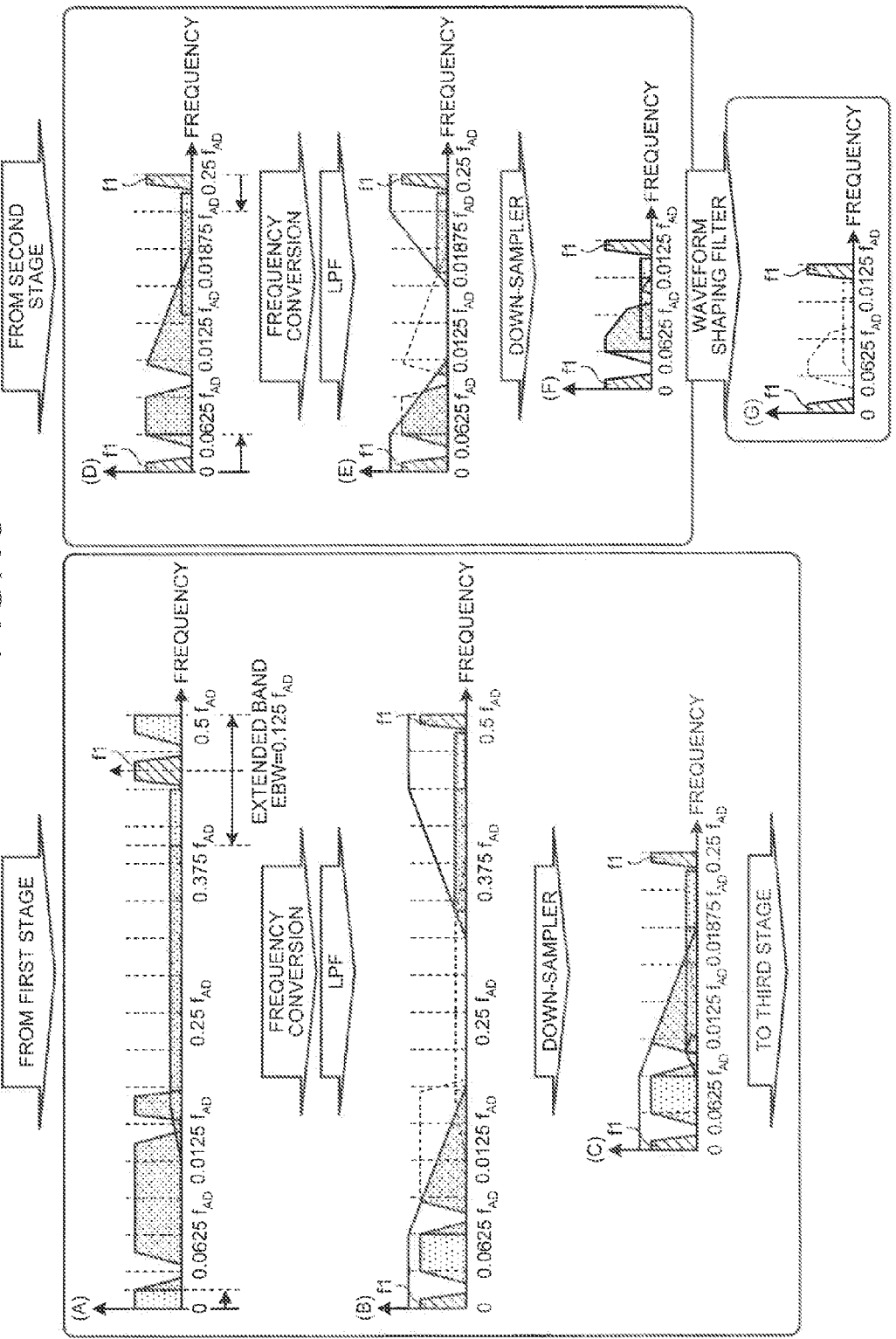
FIG. 16 is a diagram of processing carried out by the frequency-converting/reception-low-pass filter unit in the second stage and the frequency converting/reception-low-pass filter unit and the reception-waveform shaping filter in the third stage shown on the frequency axis.

FIG. 16 is a diagram of processing carried out by the frequency converting/reception-low-pass filter unit 12-3 in the second stage and the frequency converting/reception-low-pass filter unit 12-7 in the third stage and the reception-waveform shaping filter 14 shown on the frequency axis.

Among the four band signals f1 to f4 shown in (A) of FIG. 8, signals (signals including the band signals f1 and f2) after being processed by the frequency converting/reception-low-pass filter unit 12-1 are input to the frequency converting/ reception-low-pass filter unit 12-3. However, the frequency converting/reception-low-pass filter unit 12-3 sets the band signal f1 of the signals as a target to be allowed to pass.

(A) at the top on the left side of FIG. 16 indicates a spectrum of a signal input from the frequency converting/reception-low-pass filter unit 12-1 to the frequency converting/reception-low-pass filter unit 12-3. First, the frequency converting unit 31 of the frequency converting/reception-low-pass filter unit 12-3 frequency converts, based on an instruction of the reception-filter-bank control unit 2, the center frequency of the band signal f1 to be zero. Extended band width is $EBW=f_{AD}/2^2=0.125 \times f_{AD}$.

(B) second from the top on the left side of FIG. 16 indicates a spectrum after passage through the low-pass filter unit (in-phase side) 32 and the low-pass filter unit (quadrature side) 33. A thick line indicates frequency characteristics of the low-pass filter unit (in-phase side) 32 and the low-pass filter unit (quadrature side) 33. As it is seen from the figure, as in the case of the first stage, the low-pass filter unit (in-phase side) 32 and the low-pass filter unit (quadrature side) 33 allow an extended band to pass and remove harmonics. Therefore, even if a sampling frequency is curtailed to a half, an alias component does not overlap the extended band. A spectrum after down-sample shown in (C) third from the top on the left side of FIG. 16 is obtained. An output of the frequency converting/reception-low-pass filter unit 12-3 is input to the frequency converting/reception-low-pass filter unit 12-7 in the third stage.

(D) at the top on the right side of FIG. 16 indicates a spectrum of a signal input to the frequency converting/reception-low-pass filter unit 12-7 in the third stage. The frequency converting/reception-low-pass filter unit 12-7 allows the band signal f1 indicated by hatching to pass.

The frequency converting unit 31 of the frequency converting/reception-low-pass filter unit 12-7 frequency-converts, based on an instruction of the reception-filter-bank control unit 2, the center frequency of the band signal f1 to be zero. However, the center frequency of the band signal f1 is already frequency-converted in the same manner in the second stage. Therefore, actually, the frequency conversion is not performed. Extended band width is $EBW=f_{AD}/2^3=0.0625 \times f_{AD}$.

(E) second from the top on the right side of FIG. 16 indicates a spectrum after passage through the low-pass filter unit (in-phase side) 32 and the low-pass filter unit (quadrature side) 33. A thick line indicates frequency characteristics of the low-pass filter unit (in-phase side) 32 and the low-pass filter unit (quadrature side) 33. As it is seen from the figure, as in the case of the second stage, the low-pass filter unit (in-phase side) 32 and the low-pass filter unit (quadrature side) 33 allow an extended band to pass and remove harmonics. Therefore, even if a sampling frequency is curtailed to a half, an alias component does not overlap the extended band. A spectrum after down-sample shown in (F) third from the top on the right side of FIG. 16 is obtained. An output of the frequency converting/reception-low-pass filter unit 12-7 is input to the reception-waveform shaping filter 14.

(G) fourth from the top of FIG. 16 indicates a signal after the band signal f1 is extracted by the reception-waveform shaping filter 14. A thick line in (G) of FIG. 16 indicates a frequency characteristic of the reception-waveform shaping filter 14. As it is seen from the figure, the reception-waveform shaping filter 14 extracts only the band signal f1 from data output from the frequency converting/reception-low-pass filter unit 12-7 and removes all remaining unnecessary waves.

Figure 17:
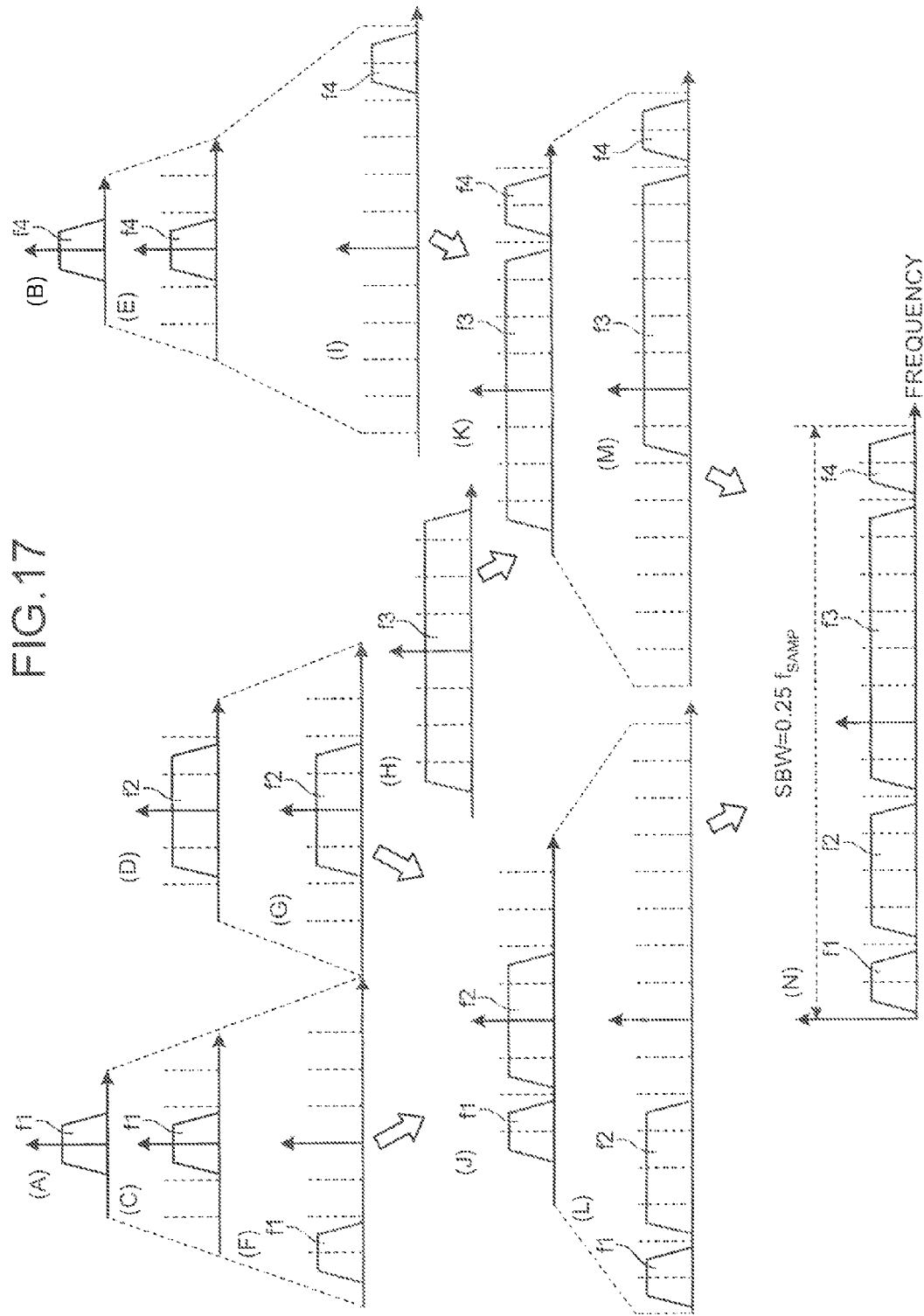
FIG. 17 is a diagram of the operation of multiplexing processing in the first embodiment.

The operation of the multiplexing processing in this embodiment is explained below. FIG. 17 is a diagram of the operation of the multiplexing processing in this embodiment.

First, conditions explained below are assumed. A maximum of band widths of band signals included in the system SBW ($=0.25 f_{SAMP}$) after multiplexing is set to be equal to or larger than a half of the system band SBW ($=0.125 f_{SAMP}$). For example, in an example shown in FIG. 17, a spectrum of a signal after the multiplexing processing is shown in (N) at the bottom. However, as it is seen in this figure, in the signal after the multiplexing processing, band width of the band signal f3 having the largest band width is 0.5 SBW and satisfies the condition explained above. However, $f_{SAMP}$ indicates a sampling frequency of the D/A 25.

The multiplexing processing in this embodiment is realized by (A) and (B) below.

(A) The transmission-filter-bank control unit 5 grasps frequency arrangement and band width of a band signal after multiplexing from transmission channel information sent from a system (e.g., a system of a transmitting apparatus in which the multiplexing apparatus according to this embodiment is incorporated) and calculates a demultiplexing processing procedure in demultiplexing the grasped band signals after multiplexing according to a flow and rules of demultiplexing of (1) to (11) explained below.

(B) The transmission-filter-bank control unit 5 carries out processing opposite to the demultiplexing processing procedure calculated in (A) (=multiplexing processing).

Concerning the example shown in FIG. 17, a multiplexing processing procedure is explained below according to (A) and (B) explained above. First, as explained in (A), the transmission-filter-bank control unit 5 grasps, based on the transmission channel information, frequency arrangement and band widths of signals after multiplexing. Specifically, the transmission-filter-bank control unit 5 grasps a spectrum shown in (N) at the bottom of FIG. 17. The transmission-filter-bank control unit 5 calculates a demultiplexing processing procedure in demultiplexing a signal in (N) at the bottom of FIG. 17. Because (N) of FIG. 17 and (A) of FIG. 8 are the same spectrum, the demultiplexing procedure in FIG. 17(N) coincides with the demultiplexing procedure explained with reference to FIG. 8 as an example.

Subsequently, the multiplexing processing in (B) is carried out as a procedure opposite to the demultiplexing procedure calculated in (A). In the multiplexing processing, to use the same stage numbers as the demultiplexing processing, a stage closest to the D/A 25 is represented as first stage, a stage second closest to the D/A 25 is represented as second stage, and so on. Therefore, in the configuration shown in FIG. 2, the multiplexing processing is performed in the order of the modulating unit 7, the transmission-waveform shaping filter 21, the transmission selector 22, the transmission-low-pass filter/frequency converting unit in the third stage, the transmission-low-pass filter/frequency converting unit in the second stage, and the transmission-low-pass filter/frequency converting unit in the first stage.

The transmission-waveform shaping filter 21 waveform-shapes a plurality of transmission signals mapped on a Q complex plane by the modulating unit 7 and performs band limitation. A signal after the waveform shaping is generated as a signal, a center frequency of which is zero.

The transmission-filter-bank control unit 5 selects, based on the signal after the multiplexing, the transmission-low-pass filter/frequency converting unit to which each of band signals after the waveform shaping should be output and instructs the transmission selector 22 about the transmission-low-pass filter/frequency converting unit. In the case of the example shown in FIG. 17, as the third stage, the transmission-filter-bank control unit 5 transmits the band signals to transmission-low-pass filter/frequency converting units 23-1 and 23-8.

In the transmission-low-pass filter/frequency converting unit 23-1 in the third stage, the up-sampler 35 up-samples the band signal f1, the center frequency of which is zero, output from the transmission-waveform shaping filter 21 through the transmission selector 22 (in the following explanation, in the case of transmission through the transmission selector 22, the expression "through the transmission selector 22" is omitted) to a double. The low-pass filter unit (in-phase side) 32 and the low-pass filter unit (quadrature side) 33 perform frequency conversion based on a frequency setting value designated from the transmission-filter-bank control unit 5 ((A) to (C) of FIG. 17).

The transmission-filter-bank control unit 5 calculates this frequency setting value as a value obtained by reversing a sign of a frequency conversion amount concerning the band signal f1 in the third stage of the demultiplexing processing procedure calculated in (A). Specifically, when the frequency conversion amount in the third stage of the demultiplexing processing procedure is represented as +Δf, a frequency conversion amount in the third stage in a multiplexing process is −Δf.

Similarly, in the transmission-low-pass filter/frequency converting unit 23-8 in the third stage, the up-sampler 35 up-samples the band signal f4, the center frequency of which is zero, output from the transmission-waveform shaping filter 21 to a double. The low-pass filter unit (in-phase side) 32 and the low-pass filter unit (quadrature side) 33 perform frequency conversion based on a frequency setting value designated from the transmission-filter-bank control unit 5 ((B) to (E) of FIG. 17).

In this example, there is no processing for dividing a signal into two band signals in the third stage of the demultiplexing processing procedure. Therefore, addition processing is not performed in the third stage of the multiplexing processing, and the process proceeds to the second stage.

In the transmission-low-pass filter/frequency converting unit 23-9 in the second stage, the up-sampler 35 up-samples the band signal f1 output from the transmission-low-pass filter/frequency converting unit 23-1 to a double. The low-pass filter unit (in-phase side) 32 and the low-pass filter unit (quadrature side) 33 perform frequency conversion based on a frequency setting value designated from the transmission-filter-bank control unit 5 ((C) to (F) of FIG. 17). At this point, the transmission-filter-bank control unit 5 calculates the frequency setting value as a value obtained by reversing a sign of a frequency conversion amount concerning the band signal f1 in the second stage of the demultiplexing processing procedure.

The band signal f2, the center frequency of which is zero, is output from the transmission-waveform shaping filter 21 to the transmission-low-pass filter/frequency converting unit 23-10 in the second stage. In the transmission-low-pass filter/frequency converting unit 23-10, the up-sampler 35 up-samples this signal to a double. The low-pass filter unit (in-phase side) 32 and the low-pass filter unit (quadrature side) 33 perform frequency conversion based on a frequency setting value designated from the transmission-filter-bank control unit 5 ((D) to (G) on the upper left of FIG. 17). At this point, the transmission-filter-bank control unit 5 calculates the frequency setting value as a value obtained by reversing a sign of a frequency conversion amount concerning the band signal f2 in the second stage of the demultiplexing processing procedure.

In this example, the band signals f1 and f2 are divided in the second stage of the demultiplexing processing procedure. Therefore, in the second stage of the multiplexing processing, the adder 24-5 adds up the band signal f1 output from the transmission-low-pass filter/frequency converting unit 23-9 and the band signal f2 output from the transmission-low-pass filter/frequency converting unit 23-10 ((J) of FIG. 17).

Similarly, in the transmission-low-pass filter/frequency converting unit 23-12 in the second stage, the up-sampler 35 up-samples the band signal f4 output from the transmission-low-pass filter/frequency converting unit 23-8 to a double. The low-pass filter unit (in-phase side) 32 and the low-pass filter unit (quadrature side) 33 perform frequency conversion based on a frequency setting value designated from the transmission-filter-bank control unit 5 ((E) to (I) of FIG. 17). At this point, the transmission-filter-bank control unit 5 calculates the frequency setting value as a value obtained by reversing a sign of a frequency conversion amount concerning the band signal f4 in the second stage of the demultiplexing processing procedure.

In this example, the band signal f3 is output to the reception-waveform shaping filter 14 in the second stage of the demultiplexing processing procedure. Therefore, in the second stage of the multiplexing processing, the adder 24-6 adds up the band signal f4 output from the transmission-low-pass filter/frequency converting unit 23-12 and the band signal f3 ((H) of FIG. 17), the center frequency of which is zero, output from the transmission-waveform shaping filter 21 ((K) of FIG. 17)). The transmission-filter-bank control unit 5 controls the transmission selector 22 such that each of the band signals f2 and f3 is output to the transmission-low-pass filter/frequency converting unit 23-10 and the adder 24-6.

Subsequently, in the transmission-low-pass filter/frequency converting unit 23-13 in the first stage, the up-sampler 35 up-samples a multiplexed signal of the band signals f1 and f2 output from the adder 24-5 to a double. The low-pass filter unit (in-phase side) 32 and the low-pass filter unit (quadrature side) 33 perform frequency conversion based on a frequency setting value designated from the transmission-filter-bank control unit 5 ((J) to (L) of FIG. 17). At this point, the transmission-filter-bank control unit 5 calculates the frequency setting value as a value obtained by reversing a sign of a frequency conversion amount at the time of the division of the band signals f1 and f2 in the first stage of the demultiplexing processing procedure.

Similarly, in the transmission-low-pass filter/frequency converting unit 23-14 in the first stage, the up-sampler 35 up-samples a multiplexed signal of the band signals f3 and f4 output from the adder 24-6 to a double. The low-pass filter unit (in-phase side) 32 and the low-pass filter unit (quadrature side) 33 perform frequency conversion based on a frequency setting value designated from the transmission-filter-bank control unit 5 ((K) to (M) of FIG. 17). At this point, the transmission-filter-bank control unit 5 calculates the frequency setting value as a value obtained by reversing a sign of a frequency conversion amount at the time of the division of the band signals f3 and f4 in the first stage of the demultiplexing processing procedure.

The adder 24-7 adds up an output of the transmission-low-pass filter/frequency converting unit 23-13 and an output of the transmission-low-pass filter/frequency converting unit 23-14. The D/A 25 D/A-converts a signal after the addition into a multiplexed signal.

When signals to be multiplexed are other signals such as signals shown in FIG. 9(A) or 10(A) other than FIG. 8, as in the case explained above, the multiplexing processing can be performed by performing processing opposite to the demultiplexing procedure for each of the signals.

For example, in the multiplexing processing shown in FIG. 17, the transmission-low-pass filter/frequency converting units 23-2 to 23-7 and 23-11 shown in FIG. 2 are not used. Therefore, to reduce power consumption, the transmission-filter-bank control unit 5 specifies, based on transmission channel information, the transmission-low-pass filter/frequency converting units not in use and instructs, using a clock control signal, the clock supplying unit 6 to stop supply of a clock signal to the transmission-low-pass filter/frequency converting units.

Usually, the clock supplying unit 6 supplies a clock signal to all the components shown in FIG. 2. However, according to the clock control signal from the transmission-filter-bank control unit 5, the clock supplying unit 6 stops the supply of the clock signal to the transmission-low-pass filter/frequency converting units not in use.

The transmission-waveform shaping filter 21 and the modulating unit 7 are configured to be capable of performing a multiplexing operation for maximum eight band signals such that the transmission-waveform shaping filter 21 and the modulating unit 7 can deal with multiplexing of signals having a narrowest band. Therefore, as in the reception-waveform shaping filter 14 and the demodulating unit 4 in the case of the demultiplexing apparatus, within the transmission-waveform shaping filter 21 and the modulating unit 7, it is also conceivable that all the circuits are not used, for example, in an operation example for handling four band signals.

Therefore, to further reduce power consumption, in this embodiment, the clock supplying unit 6 stops, based on the clock transmission signal from the transmission-filter-bank control unit 5, supply of the clock signal not only to the transmission-low-pass filter/frequency converting units but also to the circuits not in use inside of the transmission-waveform shaping filter 21 and the modulating unit 7.

For example, when the band signals f3 and f4 among the band signals f1 to f4 shown in FIG. 17 are not present, components and circuits not in use increase. Therefore, sections, supply of the clock signal to which can be stopped, increases and power consumption can be reduced. In other words, as in the case of the demultiplexing apparatus, the multiplexing apparatus according to this embodiment can reduce power consumption in proportion to band widths of a signal group to be processed.

Operation details in performing the multiplexing shown in FIG. 17 are explained below with reference to FIGS. 18 to 22. In FIGS. 18 to 22, a sampling frequency of the D/A 25 is represented as $f_{AD}$. However, a relation between $f_{AD}$ and $f_{SAMP}$ is $f_{SAMP}=f_{AD}$.

Figure 18:
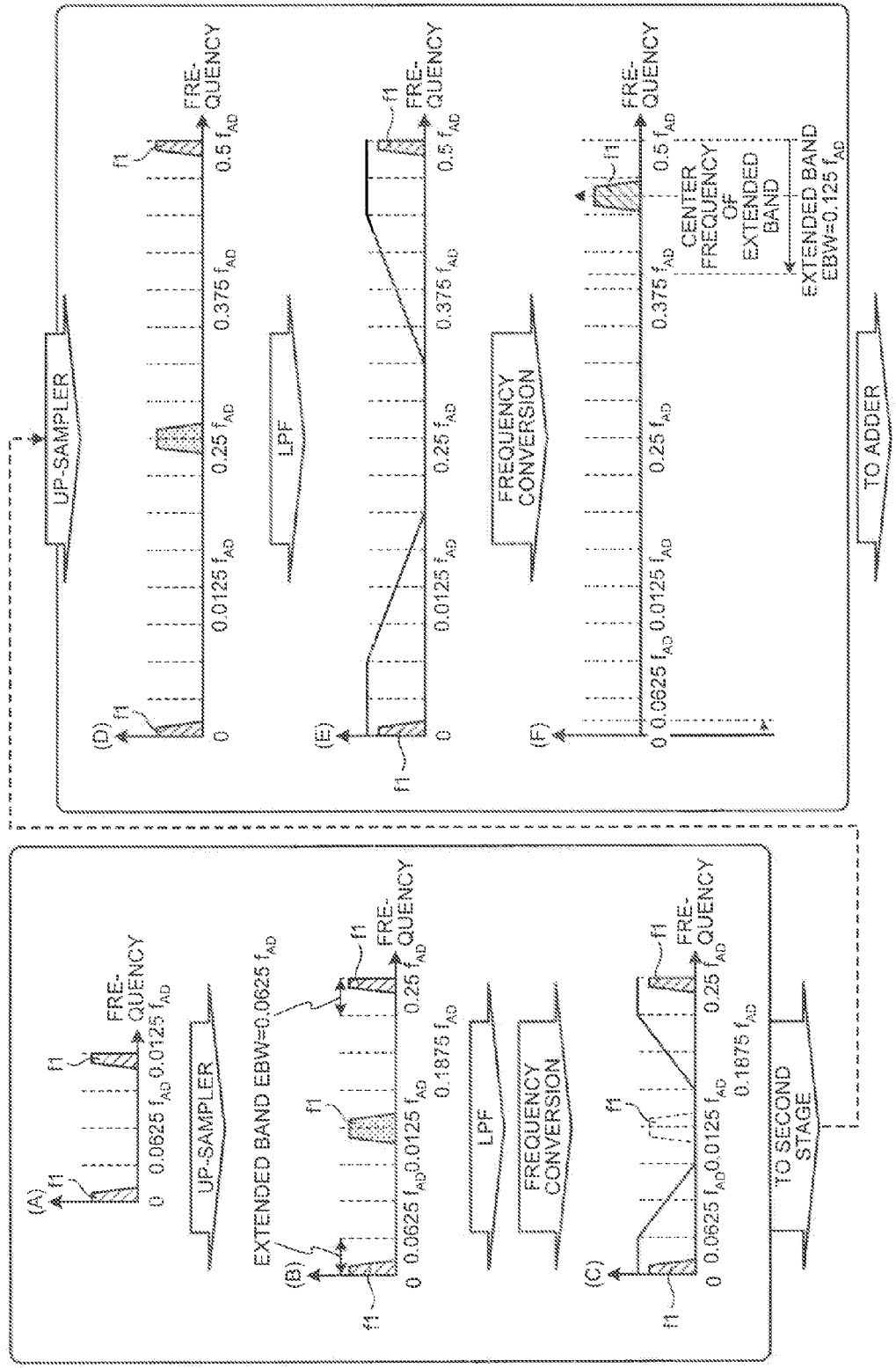
FIG. 18 is a diagram of processing applied to a band signal f1 shown in the frequency axis.

FIG. 18 is a diagram of processing in the third stage applied to the band signal f1 by the transmission-low-pass filter/frequency converting unit 23-1 and processing in the second stage applied to the band signal f1 by the transmission-low-pass filter/frequency converting unit 23-9 shown on the frequency axis. In the transmission-low-pass filter/frequency converting unit 23-1, the up-sampler 35 up-samples the band signal f1 input from the transmission-waveform shaping filter 21 ((A) of FIG. 18) to a double ((B) of FIG. 18). The low-pass filter unit (in-phase side) 32 and the low-pass filter unit (quadrature side) 33 remove an image component (a spectrum indicated by gray in (B) of FIG. 18) generated in the up-sample. Subsequently, the frequency converting unit 36 frequency-converts, based on a frequency setting value instructed from the transmission-filter-bank control unit 5, a signal after the removal of the image component. In the transmission-low-pass filter/frequency converting unit 23-1, because zero is instructed as the frequency setting value, a spectrum after the frequency conversion is the same as a spectrum after low-pass filtering ((C) of FIG. 18).

The band signal f1 output from the transmission-low-pass filter/frequency converting unit 23-1 is input to the transmission-low-pass filter/frequency converting unit 23-9. In the transmission-low-pass filter/frequency converting unit 23-9, the up-sampler 35 up-samples the input signal to a double ((D) of FIG. 18). The low-pass filter unit (in-phase side) 32 and the low-pass filter unit (quadrature side) 33 remove an image component generated in the up-sample ((E) of FIG. 18). Subsequently, the frequency converting unit 36 frequency-converts, based on a frequency setting value instructed from the transmission-filter-bank control unit 5, a signal after the removal of the image component ((F) of FIG. 18).

Figure 19:
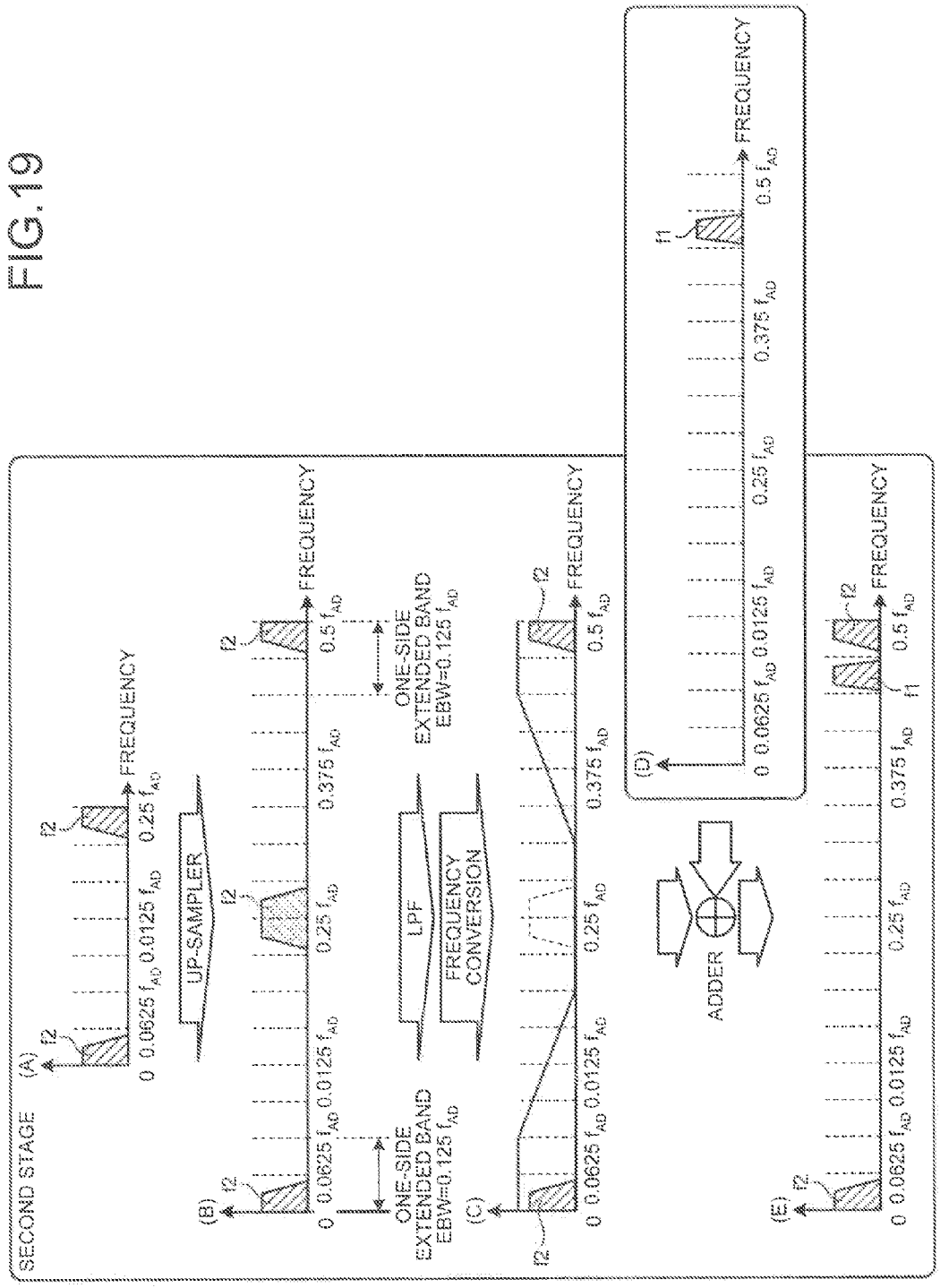
FIG. 19 is a diagram of multiplexing processing for the band signal f1 and a band signal f2 shown on the frequency axis.

FIG. 19 is a diagram of processing applies to the band signal f2 in the second stage and multiplexing processing for the band signal f1 and the band signal f2 carried out by the transmission-low-pass filter/frequency converting unit 23-10 shown on the frequency axis.

In the transmission-low-pass filter/frequency converting unit 23-10, the up-sampler 35 up-samples the band signal f2 input from the transmission-waveform shaping filter 21 ((A) of FIG. 19) to a double ((B) of FIG. 19). The low-pass filter unit (in-phase side) 32 and the low-pass filter unit (quadrature side) 33 remove an image component generated in the up-sample ((C) of FIG. 19). Subsequently, the frequency converting unit 36 frequency-converts, based on a frequency setting value instructed from the transmission-filter-bank control unit 5, a signal after the removal of the image component. In the transmission-low-pass filter/frequency converting unit 23-10, because zero is instructed as the frequency setting value, a spectrum after the frequency conversion is the same as a spectrum after low-pass filtering ((D) of FIG. 19).

The adder 24-5 adds up an output of the transmission-low-pass filter/frequency converting unit 23-10 and an output of the transmission-low-pass filter/frequency converting unit 23-9 and outputs an added-up output ((E) of FIG. 19).

Figure 20:
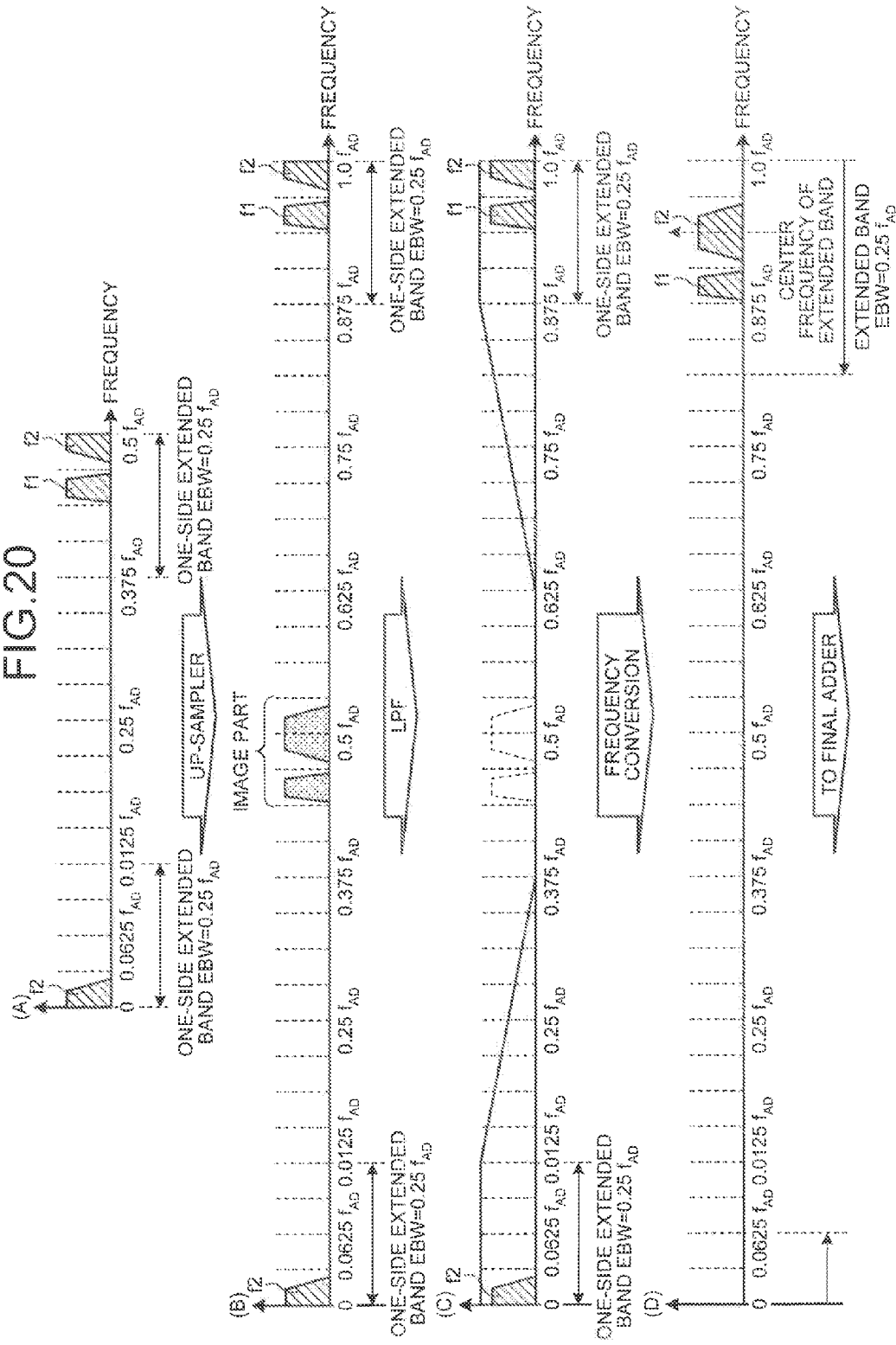
FIG. 20 is a diagram of processing for a multiplexed signal of the band signals f1 and f2 shown on the frequency axis.

FIG. 20 is a diagram of processing for a multiplexed signal of the band signals f1 and f2 in the first stage carried out by the transmission-low-pass filter/frequency converting unit 23-12 shown on the frequency axis. In the transmission-low-pass filter/frequency converting unit 23-12, the up-sampler 35 up-samples a multiplexed signal output from the adder 24-5 ((A) of FIG. 20) to a double ((B) of FIG. 20). The low-pass filter unit (in-phase side) 32 and the low-pass filter unit (quadrature side) 33 remove an image component generated in the up-sample ((C) of FIG. 20). Subsequently, the frequency converting unit 36 frequency-converts, based on a frequency setting value instructed from the transmission-filter-bank control unit 5, a signal after the removal of the image component ((D) of FIG. 20).

Figure 21:
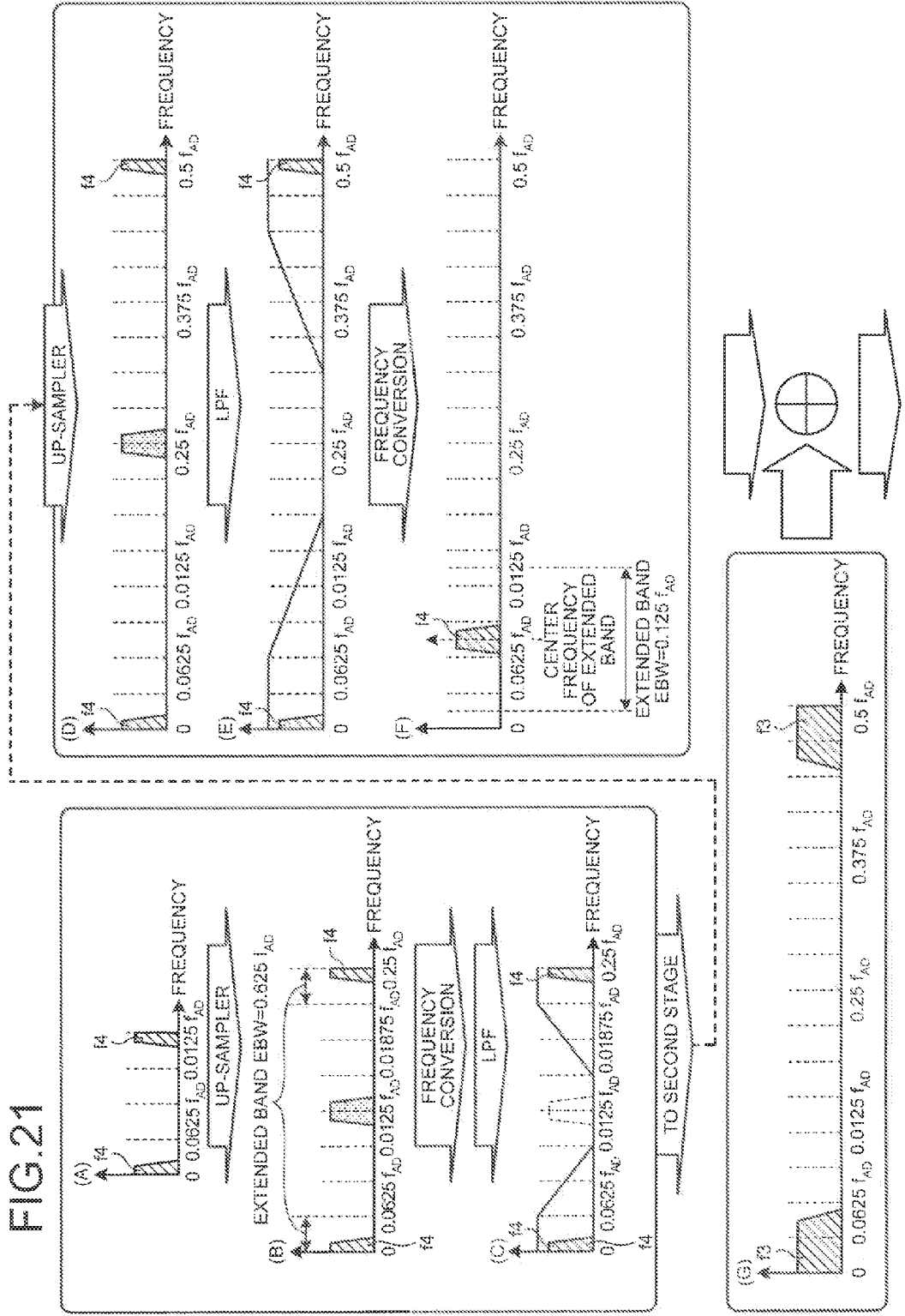
FIG. 21 is a diagram of multiplexing processing for a band signal f3 and a band signal f4 shown on the frequency axis.

FIG. 21 is a diagram of processing in the third stage carried out by the transmission-low-pass filter/frequency converting unit 23-8, processing for the band signal f4 in the second stage carried out by the transmission-low-pass filter/frequency converting unit 23-12, and multiplexing processing for the band signal f3 and the band signal f4 shown on the frequency axis.

In the transmission-low-pass filter/frequency converting unit 23-8, the up-sampler 35 up-samples the band signal f4 input from the transmission-waveform shaping filter 21 ((A) of FIG. 21) to a double ((B) of FIG. 21). The low-pass filter unit (in-phase side) 32 and the low-pass filter unit (quadrature side) 33 remove an image component generated in the up-sample ((C) of FIG. 21). Subsequently, the frequency converting unit 36 frequency-converts, based on a frequency setting value instructed from the transmission-filter-bank control unit 5, a signal after the removal of the image component. In the transmission-low-pass filter/frequency converting unit 23-10, because zero is instructed as the frequency setting value, a spectrum after the frequency conversion is the same as a spectrum after low-pass filtering ((C) of FIG. 21).

In the transmission-low-pass filter/frequency converting unit 23-12, the up-sampler 35 up-samples the band signal f4 input from the transmission-low-pass filter/frequency converting unit 23-8 to a double ((D) of FIG. 21). The low-pass filter unit (in-phase side) 32 and the low-pass filter unit (quadrature side) 33 remove an image component generated in the up-sample ((E) of FIG. 21). Subsequently, the frequency converting unit 36 frequency-converts, based on a frequency setting value instructed from the transmission-filter-bank control unit 5, a signal after the removal of the image component ((F) of FIG. 21). The adder 24-6 adds up an output of the transmission-low-pass filter/frequency converting unit 23-12 ((F) of FIG. 21) and the band signal f3 input from the transmission-waveform shaping filter 21 ((G) of FIG. 21).

Figure 22:
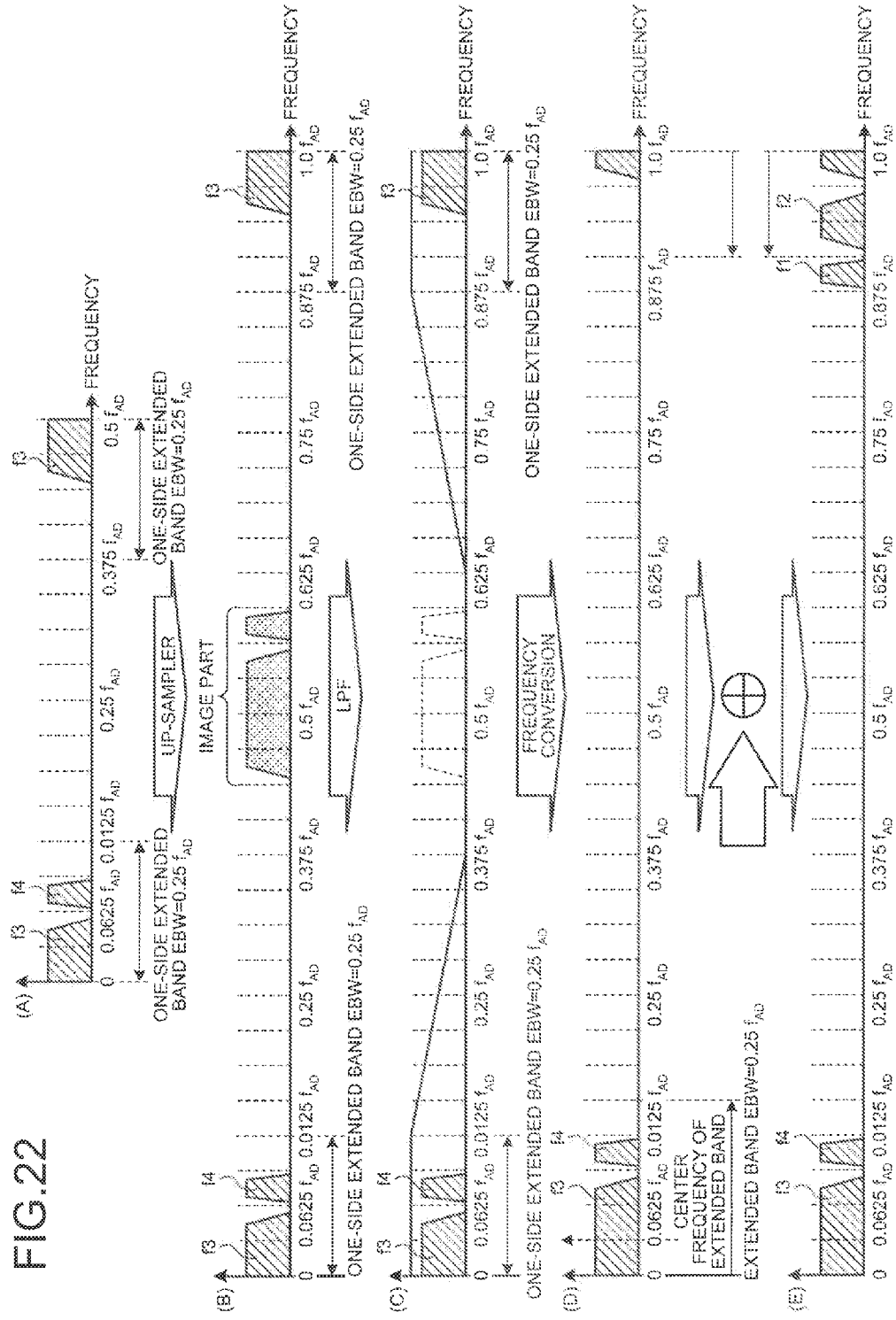
FIG. 22 is a diagram of multiplexing processing for multiplexing a multiplexed signal of the band signals f1 and f2 and a multiplexed signal of the band signals f3 and f4 shown on the frequency axis.

FIG. 22 is a diagram of processing in the first stage carried out by the transmission-low-pass filter/frequency converting unit 23-13 and multiplexing processing for multiplexing a multiplexed signal of the band signals f1 and f2 and a multiplexed signal of the band signals f3 and f4 shown on the frequency axis.

In the transmission-low-pass filter/frequency converting unit 23-13, the up-sampler 35 up-samples a multiplexed signal output from the adder 24-6 ((A) of FIG. 22) to a double ((B) of FIG. 22). The low-pass filter unit (in-phase side) 32 and the low-pass filter unit (quadrature side) 33 remove an image component generated in the up-sample ((C) of FIG. 22). Subsequently, the frequency converting unit 36 frequency-converts, based on a frequency setting value instructed from the transmission-filter-bank control unit 5, a signal after the removal of the image component ((D) of FIG. 22).

The adder 24-7 adds up an output of the transmission-low-pass filter/frequency converting unit 23-13 and an output of the transmission-low-pass filter/frequency converting unit 23-14 and outputs an addition result to the D/A 25 ((E) of FIG. 22).

The demultiplexing processing is explained above concerning the examples shown in FIGS. 8, 9, and 10 and the multiplexing processing is explained above concerning the example shown in FIG. 17. However, the demultiplexing processing and the multiplexing processing in this embodiment are not limited to these examples. The demultiplexing processing and the multiplexing processing can also be applied in the same manner when two, four, and eight-wave equal multiplexing and demultiplexing performed in the related art are performed.

For example, in the case of the eight-wave equal demultiplexing (demultiplexing to a band signal having equal band width), an input signal is processed using all the frequency converting units/reception-low-pass filter units 12-1 to 12-14 shown in FIG. 1. Eight demultiplexed signals are output from the frequency converting units/reception-low-pass filter units 12-9 to 12-14 in the third stage. Similarly, in the case of the eight-wave equal multiplexing, signals to be subjected to the multiplexing processing are processed and multiplexed using all the transmission-low-pass filter units/frequency converting units 23-1 to 23-14 shown in FIG. 2 and adders 24-1 to 24-7 shown in FIG. 2.

In the example explained in this embodiment, the number of stages is three. However, irrespective of the number of stages, the demultiplexing processing and the multiplexing processing in this embodiment can be carried out in the same manner as long as the number of stages is an integer equal to or larger than 1.

When a wide-band signal having relatively wide band width (e.g., a band signal having band width of SBW/2, SBW/4, or the like) is not present and only a band signal having small band width (e.g., a band signal having band width of SBW/32, SBW/64, or the like) is present with respect to the system band SBW, it is possible to increase minimum frequency step width of a frequency setting value of the frequency converting unit 31 (make the minimum frequency step width approximate) and reduce the circuit size of the frequency converting unit 31. In this case, in the processing of (7) above, frequency offset for accurately setting a center frequency of a selected signal to zero does not have to be given from the first stage. Frequency conversion can be performed to frequency-offset the center frequency of the selected signal to near zero and repeated in the stages to gradually bring the center frequency of the selected signal close to zero and completely set the center frequency to zero in last frequency offset processing immediately before signal extraction.

The configurations of the demultiplexing apparatus and the multiplexing apparatus according to this embodiment are tree configurations as shown in FIGS. 1 and 2. When the number of stages n increases, the number $2^n$ of the frequency converting/reception-low-pass filter units and the transmission-low-pass filter/frequency converting units increases but working speed decreases to $\frac{1}{2}^n$. Therefore, the circuits of the frequency converting/reception-low-pass filter units (or the transmission-low-pass filter/frequency converting units) in the case of n stages can be integrated as one circuit to realize signal processing, which is originally performed in the $2^n$ circuits, as time-division processing in the one circuit using a high-speed sampling clock (clock rate: $f_{SAMP}$). In this case, the arithmetic (multiplication and addition) circuits in the low-pass filter unit (in-phase side) 32 and the low-pass filter unit (quadrature side) 33 and the complex multiplying unit 41 and the local-signal generating unit 42 of the frequency converting unit 31 (the frequency converting unit 36) can be shared by the frequency converting/reception-local-pass filter units (or the transmission-low-pass filter/frequency converting units). Therefore, it is possible to reduce circuit size compared with the case of the tree configurations.

Frequency offset values of the frequency converting/reception-low-pass filter units (or the transmission-low-pass filter/frequency converting units) in the stages can be set to either one of two values +45 [deg/sample] and −45 [deg/sample] to halve a sampling frequency of the A/D processing and the D/A processing from $f_{SAMP}$ to 0.5 $f_{SAMP}$ and further reduce power consumption. In this case, frequency arrangement that allows demultiplexing or multiplexing is limited. However, the frequency converting/reception-low-pass filter units (or the transmission-low-pass filter/frequency converting units) can be configured as a simple circuit. Therefore, the effect of a reduction in power consumption increases.

In this way, in this embodiment, the reception-filter-bank control unit 2 determines, based on reception channel information, a dividing position and an offset amount of a frequency and instructs the frequency converting/reception-low-pass filter unit about the dividing position and the offset amount. The frequency converting/reception-low-pass filter unit demultiplexes a reception signal based on the instruction. Therefore, it is possible to deal with free frequency arrangement with a simple configuration.

The transmission-filter-bank control unit 5 instructs, based on transmission channel information, the transmission-low-pass filter/frequency converting unit to perform processing opposite to the demultiplexing processing. The transmission-low-pass filter/frequency converting unit multiplexes a reception signal based on the instruction. Therefore, it is possible to deal with free frequency arrangement with a simple configuration.

Further, the demultiplexing apparatus and the multiplexing apparatus according to this embodiment specify, based on transmission or reception channel information, components not in use and stop supply of a clock signal to the specified components. Therefore, it is possible to realize a reduction in power consumption in proportion to signal band width set as a target of demultiplexing/multiplexing.

Second Embodiment

Figure 23:
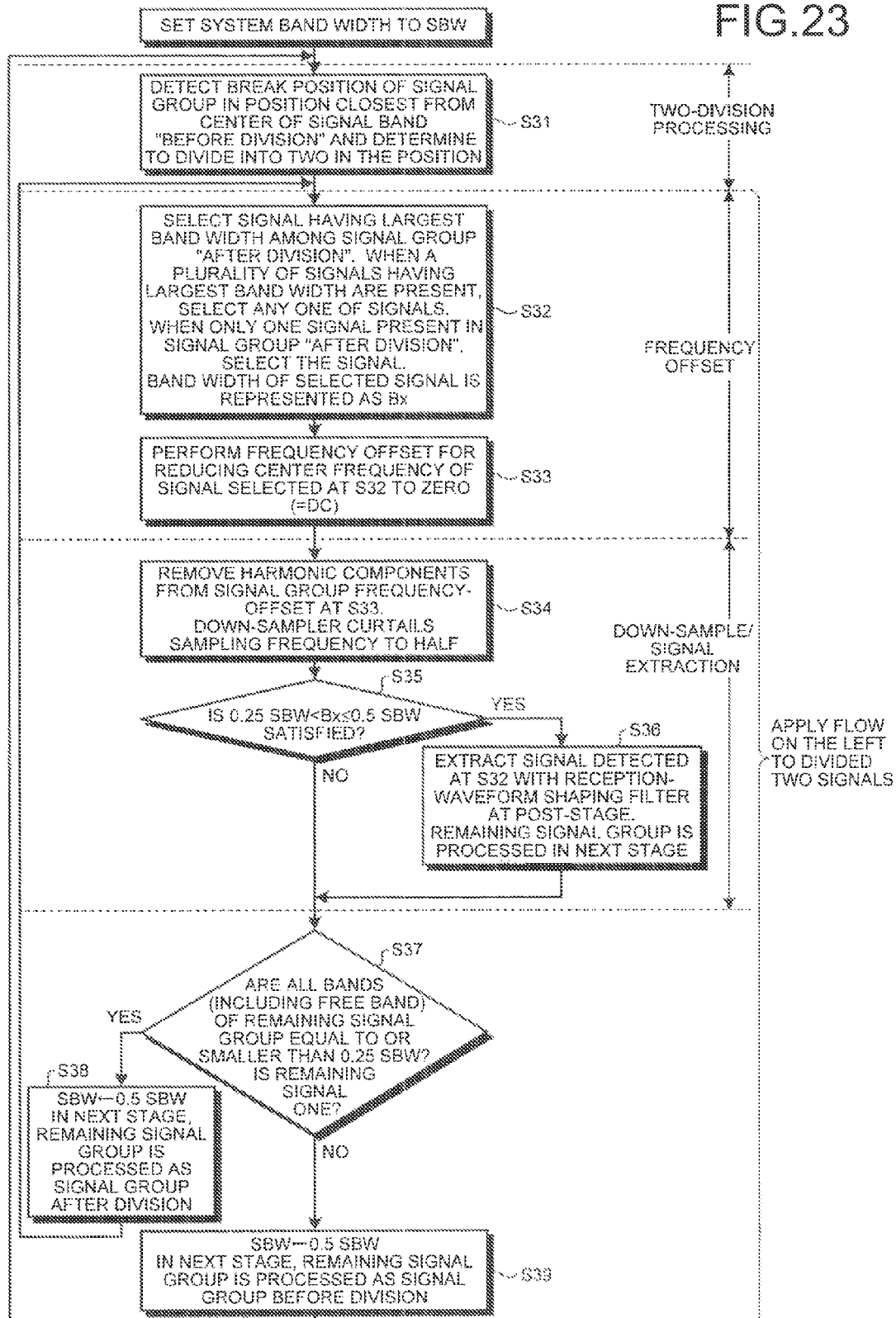
FIG. 23 is a flowchart of an example of a demultiplexing processing procedure carried out by a demultiplexing apparatus according to a second embodiment.

FIG. 23 is a flowchart for explaining an example of a demultiplexing processing procedure carried out by the demultiplexing apparatus according to the present invention. The configurations of the demultiplexing apparatus and the multiplexing apparatus according to this embodiment are the same as those of the demultiplexing apparatus and the multiplexing apparatus according to the first embodiment. Therefore, differences from the first embodiment are explained below.

In this embodiment, the demultiplexing processing procedure explained with reference to FIG. 11 of the first embodiment is simplified. In this case, a signal branches into three in some case and a flow of signal processing is complicated. However, the processing by the reception-filter-bank control unit 2 and the transmission-filter-bank control unit 5 can be simplified.

A demultiplexing processing procedure in this embodiment is explained with reference to FIG. 23. First, the reception-filter-bank control unit 2 detects a break position of a signal group (band signals) present in a position closest from a center frequency of a signal band before division and sets the detected position as a dividing position (step S31). The following steps S32 to S39 are the same as steps S18 to S25 in the first embodiment.

For example, when a reception signal including six band signals g1 to g6 having band widths of 0.1 SBW, 0.3 SBW, 0.1 SBW, 0.1 SBW, 0.2 SBW, and 0.2 SBW is demultiplexed, in the demultiplexing processing procedure in this embodiment, the band signals are divided into two groups of the band signals g1 to g3 and g4 to g6. It is assumed that intervals among the band signals are sufficiently small compared with the band widths. In this case, three-division processing for dividing, while extracting the band signal g3 having the band width of 0.3 SBW in the center of g1 to g3 after the division using a reception-waveform shaping filter, the remaining two signals into two in the next stage is performed.

On the other hand, in the demultiplexing processing procedure shown in FIG. 11 explained in the first embodiment, the signal processing for always dividing a signal into two is realized. For example, when the reception signal including the band signals g1 to g6 is demultiplexed in the demultiplexing processing procedure in the first embodiment, the reception signal is divided into two groups of the band signals g1 and g2 and the band signals g3 to g6. In this case, two-division processing for dividing, while extracting 0.3 SBW on the right side of the band signals g1 and g2 using the reception-waveform shaping filter 14, the remaining one signal in the next stage is performed.

In the multiplexing processing in this embodiment, the transmission-filter-bank control unit 5 calculates, based on transmission channel information, the demultiplexing processing procedure explained with reference to FIG. 23 and carries out processing opposite to the demultiplexing processing procedure. Processing in this embodiment other than the processing explained above is the same as the processing in the first embodiment.

In this way, in this embodiment, the reception-filter-bank control unit 2 determines, as a dividing position, a break position of a signal group (band signals) located in a position closest from a center frequency of a signal band before division. In the multiplexing processing, processing opposite to the demultiplexing processing procedure is performed. Therefore, compared with the first embodiment, it is possible to reduce processing loads on the reception-filter-bank control unit 2 and the transmission-filter-bank control unit 5.

Third Embodiment

FIG. 24 is a diagram of a configuration example of a third embodiment of the relay satellite according to the present invention. In this embodiment, the digital demultiplexing unit 1 and the digital multiplexing unit 8 of the demultiplexing apparatus according to the first embodiment or the second embodiment are applied to a relay satellite that perform non-reproducing relay. The relay satellite according to this embodiment includes, as shown in FIG. 24, digital demultiplexing units 100-1 to 100-m, a switch matrix 101, and digital multiplexing units 102-1 to 102-p. The digital demultiplexing units 100-1 to 100-m have a configuration same as that of the digital demultiplexing unit 1 of the demultiplexing apparatus according to the first embodiment or the second embodiment. The digital multiplexing units 102-1 to 102-p have a configuration same as that of the digital multiplexing unit 8 in the first embodiment or the second embodiment. The operation of the digital demultiplexing units 100-1 to 100-m is the same as the operation of the digital demultiplexing unit 1 in the first embodiment or the second embodiment. The operation of the digital multiplexing units 102-1 to 102-p is the same as the operation of the digital multiplexing unit 8 in the first embodiment or the second embodiment.

The relay satellite according to this embodiment demultiplexes reception signals received from m ground areas (or system areas), allocates demultiplexed signals to p areas (or system bands) set as transmission targets, and transmits a multiplexed signal to each of the areas set as the transmission targets.

The digital demultiplexing units 100-1, 100-2, . . . , and 100-m respectively demultiplex signals transmitted from areas #1, #2, . . . , and #m. The switch matrix 101 allocates the demultiplexed signals to p areas and outputs, based on an allocation result, the demultiplexed signals to the digital multiplexing units 102-1 to 102-p. The digital multiplexing units 102-1, 102-2, . . . , and 102-p multiplex the input signals respectively as signals corresponding to the areas #1, #2, . . . , and #p.

In the case of such a non-reproducing relay satellite, the demodulating unit 4 and the modulating unit 7 explained in the first embodiment are unnecessary. In this embodiment, the transmission-filter-bank control units 5 of the digital multiplexing units 102-1 to 102-p obtain transmission channel information from the switch matrix 101.

When a signal spectrum shape must not be changed before and after relay, the transmission-waveform shaping filter 21 acts as a mere channel filter, removes only unnecessary waves, and sets a flat frequency characteristic in a pass band (does not perform waveform shaping in a signal band). Further, in the non-reproducing relay satellite, signals from which unnecessary waves are removed are multiplexed again by the reception-waveform shaping filter 14. Therefore, the transmission-waveform shaping filters 21 of the digital multiplexing units 102-1 to 102-$p$ do not have to be provided.

When frequency band width usable in a satellite communication system including the relay satellite according to this embodiment is limited to SBW, frequencies allocated to respective areas are repetition with a plurality of cells set as one unit. To arrange the frequencies such that frequencies used in adjacent areas are different, for example, in the case of repetition with seven cells set as one unit, frequency band width allocated to the areas is SBW/7. In this case, the system band width SBW is divided into seven bands of f1 to f7. The bands are repeatedly used as one unit.

The demultiplexing apparatus/the multiplexing apparatus according to the first embodiment and the second embodiment can realize a reduction in power consumption according to processing band width. Therefore, it is possible to realize a reduction in power consumption of the relay satellite. In particular, in recent years, in a multi-beam satellite that realizes communication in several hundred beams (areas), m and p increase to several hundreds. This is effective for a reduction in power consumption of the multi-beam satellite.

In this way, in this embodiment, the demultiplexing apparatus/the multiplexing apparatus according to the first embodiment and the second embodiment are applied to the relay satellite that performs non-reproducing relay. Therefore, in the relay satellite, it is possible to apply, with a simple configuration, demultiplexing and multiplexing to signals having free frequency arrangement. It is possible to realize a reduction in power consumption.

INDUSTRIAL APPLICABILITY

As explained above, the demultiplexing apparatus, the multiplexing apparatus, the communication apparatus, and the relay satellite according to the present invention are useful for a system that digitally multiplexes and digitally demultiplexes a plurality of signals having various band widths and are, in particular, suitable for the relay satellite that performs non-reproducing relay.

REFERENCE SIGNS LIST

1, 100-1 to 100-$m$ DIGITAL DEMULTIPLEXING UNITS
2 RECEPTION-FILTER-BANK CONTROL UNIT
3, 6 CLOCK SUPPLYING UNITS
4 DEMODULATING UNIT
5 TRANSMISSION-FILTER-BANK CONTROL UNIT
7 MODULATING UNIT
8, 102-1 to 102-$p$ DIGITAL MULTIPLEXING UNITS
11 A/D
12-1 to 12-14 FC+RXHBFs
13 RECEPTION SELECTOR
14 RECEPTION-WAVEFORM SHAPING FILTER
21 TRANSMISSION-WAVEFORM SHAPING FILTER
22 TRANSMISSION SELECTOR
23-1 to 23-14 TXHBF+FCs
24-1 to 24-7 ADDERS
25 D/A
31, 36 FREQUENCY CONVERTING UNITS
32 LOW-PASS FILTER UNIT (IN-PHASE SIDE)
33 LOW-PASS FILTER UNIT (QUADRATURE SIDE)
34 DOWN-SAMPLER
35 UP-SAMPLER
41 COMPLEX MULTIPLYING UNIT
42 LOCAL-SIGNAL GENERATING UNIT
43 SHIFT REGISTER
44-1 to 44-19 REGISTERS
45-1 to 45-11 MULTIPLIERS
46 REAL-NUMBER ADDING UNIT
101 SWITCH MATRIX

The invention claimed is:

1. A demultiplexing apparatus including, when n (n is a natural number) represents a stage of a plurality of stages of cascade connection, in each of the stages, $2^n$ frequency converting low-pass filter units that apply frequency conversion to a processing target signal, remove a high-frequency component of a signal after the frequency conversion using low-pass filters having predetermined frequency characteristics, and down-sample and output a signal after the high-frequency component removal, the demultiplexing apparatus setting, in each of frequency converting low-pass filter units in a first stage, an input signal including a plurality of band signals, bands of which do not overlap, as the processing target signal, setting, in each of frequency converting low-pass filter units in a second and further stages, an output result of a frequency converting low-pass filter unit in a pre-stage as the processing target signal, and extracting the band signals based on output signals of the frequency converting low-pass filter units to thereby demultiplex the input signal, the demultiplexing apparatus comprising a reception-filter-bank control unit that calculates, based on channel information as known information including the bands and frequency arrangement of the band signals, a dividing position on a frequency axis for the processing target signal and a frequency offset value indicating a frequency conversion amount for divided signals divided in the dividing position and instructing, for each of the divided signals, a frequency converting low-pass filter unit, which sets the divided signal as a target of an output, about the frequency offset value, wherein the frequency converting low-pass filter unit carries out the frequency conversion based on the frequency offset value.

2. The demultiplexing apparatus according to claim 1, wherein, when the reception-filter-bank control unit determines that a band signal, band width of which is a predetermined frequency range, is present in an output signal output from a frequency converting low-pass filter unit, the reception-filter-bank control unit extracts the band signal and does not output the output signal to a frequency converting low-pass filter unit at a post-stage connected to the frequency converting low-pass filter unit that outputs the output signal.

3. The demultiplexing apparatus according to claim 2, wherein, when the reception-filter-bank control unit determines, based on the channel information, that there is a frequency converting low-pass filter unit to which an output signal from a pre-stage is not input, the reception-filter-bank control unit stops supply of a clock signal to the frequency converting low-pass filter unit to which the output signal from the pre-stage is not input and a circuit for extracting a band signal based on a signal output from the frequency converting low-pass filter unit to which the output signal from the pre-stage is not input.

4. The demultiplexing apparatus according to claim 1, wherein the reception-filter-bank control unit normalizes a system band, which is a frequency range of the input signal, at a ratio of down-sample, when the reception-filter-bank control unit determines that band signals having band widths, a ratio of which to the system band is equal to or larger than a predetermined value, are present in the processing target signal, extracts a band signal having a largest band width among the band signals, when there are a plurality of the extracted band signals, selects one of the band signals and, when one band signal is extracted, selects the band signal, and sets, of a minimum frequency and a maximum frequency of the selected band signal, a frequency close to a center frequency of the system band as the dividing position.

5. The demultiplexing apparatus according to claim 4, wherein, when the reception-filter-bank control unit determines that band signals having band widths, a ratio of which to the system band is equal to or larger than the predetermined value, are not present in the processing target signal, the reception-filter-bank control unit sets a break position of a band signal closest to the center frequency of the system band as the dividing position.

6. The demultiplexing apparatus according to claim 1, wherein the reception-filter-bank control unit sets a break position of a band signal closest to a center frequency of a system band, which is a frequency range of the input signal, as the dividing position.

7. The demultiplexing apparatus according to claim 1, wherein the reception-filter-bank control unit calculates a frequency offset value to set a center frequency of a band signal having largest band width among band signals included in the divided signal to zero.

8. A multiplexing apparatus including, when n (n is a natural number) represents a stage of a plurality of stages of cascade connection, in each of the stages, $2^n$ low-pass filter frequency converting units that apply up-sampling to a processing target signal, remove a high-frequency component from a signal after the up-sampling using low-pass filters having predetermined frequency characteristics, and apply frequency conversion to a signal after the high-frequency component removal and output the signal and further including a waveform shaping unit that generates a plurality of band signals, bands of which do not overlap, and an adding unit that performs addition processing for outputs of a low-pass filter frequency converting unit and the generated band signals or addition of the outputs of the low-pass filter frequency converting unit such that the bands do not overlap, the waveform shaping unit outputting, as the processing target signal, the generated band signals to a plurality of the low-pass filter frequency converting units different for each of the band signals and setting an addition result by the adding unit as a multiplexed signal, the multiplexing apparatus comprising transmission-filter-bank control unit that calculates, based on channel information as known information including the bands and frequency arrangement of the band signals, a low-pass filter frequency converting unit at an output destination of the band signals and a frequency offset value indicating an amount of frequency conversion carried out by the low-pass filter frequency converting unit, notifies the waveform shaping unit and the low-pass filter frequency converting unit of a calculated result, and determines a signal set as a target of the addition, wherein the waveform shaping unit outputs, based on contents of the notification, a band signal, the low-pass filter frequency converting unit carries out the frequency conversion based on the frequency offset value, and the adding unit selects, based on a result of the determination, a signal as an addition target.

9. The multiplexing apparatus according to claim 8, wherein, when the transmission-filter-bank control unit determines, based on the channel information, that there is a low-pass filter frequency converting unit to which an output signal from a pre-stage or the waveform shaping unit is not input, the transmission-filter-bank control unit stops supply of a clock signal to the low-pass filter frequency converting unit to which the output signal from the pre-stage or the waveform shaping unit is not input and a circuit for generating a signal input to the low-pass filter frequency converting unit to which the output signal from the pre-stage or the waveform shaping unit is not input.

10. The multiplexing apparatus according to claim 8, wherein the transmission-filter-bank control unit calculates, based on the channel information, a procedure for multiplexing the multiplexed signal and calculates a low-pass filter frequency converting unit at the output destination, the frequency offset value, and a signal as an addition target such that processing opposite to the procedure is performed.

11. A communication apparatus comprising the demultiplexing apparatus according to claim 1.

12. A communication apparatus comprising the multiplexing apparatus according to claim 8.

13. A relay satellite comprising:

a plurality (m (m is a natural number)) of the demultiplexing apparatuses according to claim 1;

a plurality (p (p is a natural number)) of multiplexing apparatuses; and a switch matrix unit that selects an output destination of demultiplexed signals generated by the demultiplexing apparatuses out of the multiplexing apparatuses and outputs the demultiplexed signals to the selected multiplexing apparatus, wherein the demultiplexing apparatuses demultiplex a reception signal, and the multiplexing apparatuses multiplex signals output to the multiplexing apparatuses from the switch matrix unit with the band signals and transmit multiplexes signals.

* * * * *